United States Patent
Kim et al.

(10) Patent No.: US 10,069,111 B2
(45) Date of Patent: Sep. 4, 2018

(54) ORGANIC LIGHT EMITTING DISPLAY DEVICE

(71) Applicant: LG Display Co., Ltd., Seoul (KR)

(72) Inventors: Sookang Kim, Paju-si (KR); KangJu Lee, Goyang-si (KR); Wonhoe Koo, Goyang-si (KR); Jihyang Jang, Goyang-si (KR); Hyunsoo Lim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 153 days.

(21) Appl. No.: 14/919,436

(22) Filed: Oct. 21, 2015

(65) Prior Publication Data

US 2016/0126501 A1 May 5, 2016

(30) Foreign Application Priority Data

Oct. 31, 2014 (KR) ........................ 10-2014-0149935

(51) Int. Cl.
| | |
|---|---|
| *H01L 29/08* | (2006.01) |
| *H01L 51/52* | (2006.01) |
| *H01L 27/32* | (2006.01) |
| *G03F 7/038* | (2006.01) |
| *G03F 7/00* | (2006.01) |
| *G03F 7/004* | (2006.01) |
| *G03F 7/027* | (2006.01) |
| *G03F 7/033* | (2006.01) |

(52) U.S. Cl.
CPC ........ *H01L 51/5268* (2013.01); *G03F 7/0007* (2013.01); *G03F 7/0047* (2013.01); *G03F 7/027* (2013.01); *G03F 7/033* (2013.01); *G03F 7/038* (2013.01); *H01L 27/322* (2013.01); *H01L 51/5265* (2013.01); *H01L 27/3246* (2013.01); *H01L 2251/5315* (2013.01); *H01L 2251/5369* (2013.01)

(58) Field of Classification Search
CPC .................................................... H01L 51/5268
USPC ........................................................ 257/40
See application file for complete search history.

(56) References Cited

U.S. PATENT DOCUMENTS

| | | | |
|---|---|---|---|
| 2005/0117097 A1* | 6/2005 | Noguchi | G02F 1/133555 349/114 |
| 2011/0298361 A1* | 12/2011 | Matsunaga | G02B 5/0242 313/504 |
| 2014/0234583 A1* | 8/2014 | Ryu | C01G 25/00 428/142 |
| 2015/0255754 A1* | 9/2015 | Moon | H01L 51/5268 257/89 |

* cited by examiner

*Primary Examiner* — Ajay K Arora
(74) *Attorney, Agent, or Firm* — Fenwick & West LLP

(57) ABSTRACT

Provided is an organic light emitting display device. An organic light emitting display device includes an organic light emitting element and a light scattering layer disposed on a bottom or a top of the organic light emitting element. The light scattering layer includes a photosensitive resin and dispersion particles dispersed in the photosensitive resin. The dispersion particles are configured to improve light extraction with respect to light emitted from the organic light emitting element and compensate a viewing angle with respect to the light emitted from the organic light emitting element.

10 Claims, 16 Drawing Sheets

ORGANIC LIGHT EMITTING DISPLAY DEVICE

CROSS-REFERENCE TO RELATED APPLICATIONS

This application claims the priority of Republic of Korea Patent Application No. 10-2014-0149935 filed on Oct. 31, 2014 in the Korean Intellectual Property Office, which is hereby incorporated by reference as if fully set forth herein.

BACKGROUND OF THE INVENTION

Field of the Invention

The present disclosure relates to an organic light emitting display device, and more particularly, to an organic light emitting display device and a method for manufacturing the organic light emitting display device which is improved in light efficiency and also capable of compensating a viewing angle by including a light scattering layer formed by using a photosensitive resin composition which can be photo-patterned.

Description of the Related Art

An organic light emitting display device is a self-light emitting display that does not need a separate light source unlike a liquid crystal display device. Thus, the organic light emitting display device can be manufactured into a light-weight and thin form factor. Further, the organic light emitting display device is advantageous in terms of power consumption since it is driven with a low voltage. Also, the organic light emitting display device has excellent color expression ability, a high response speed, a wide viewing angle, and a high contrast ratio (CR). Therefore, the organic light emitting display device has been considered as a next-generation display device.

A bottom-emission organic light emitting display device refers to an organic light emitting display device in which light emitted from an organic light emitting element is released to a bottom side of the organic light emitting display device. It also means an organic light emitting display device in which the light emitted from an organic light emitting element is released in a direction toward a bottom surface of a substrate on which a thin film transistor for driving the organic light emitting display device is formed. The light emitted from an organic light emitting layer of a bottom-emission organic light emitting display device can be roughly classified into an ITO/organic mode (hereinafter, referred to as "ITO mode"), a substrate mode, and an air mode on the basis of a light propagation path. The air mode refers to the light extracted to the outside of the organic light emitting display device, among lights emitted from the organic light emitting layer; the substrate mode refers to the light confined within the organic light emitting display device due to total reflection on the substrate among lights emitted from the organic light emitting layer; and the ITO mode refers to the light confined within the organic light emitting display device due to total reflection on an anode, generally formed of ITO, among lights emitted from the organic light emitting layer. In the bottom-emission organic light emitting display device, light confined within the organic light emitting display device as the ITO mode account for about 50% of the total light emitted from the organic light emitting layer. Further, light confined within the organic light emitting display device as the substrate mode account for about 30% of the total light emitted from the organic light emitting layer. Thus, the light accounting for about 80% of the total light emitted from the organic light emitting layer is confined within the organic light emitting display device and only light accounting for about 20% are extracted to the outside. Therefore, the improvement in light extraction efficiency of an organic light emitting display device is desirable.

Further, in a top-emission organic light emitting display device in which light emitted from an organic light emitting element is released to a top side of the organic light emitting display device, i.e., the opposite side to a substrate on which a thin film transistor for driving the organic light emitting display device is formed. As a result, a considerable amount of light is lost in a waveguide mode and a surface plasmon mode. To be specific, in the waveguide mode, some of light emitted from the organic light emitting element may be total-reflected within the organic light emitting display device due to a difference in refractive index between various components within the organic light emitting display device and then confined within the organic light emitting display device. Further, in the plasmon mode, some of light emitted from the organic light emitting element may be lost in the form of surface plasmon due to a surface plasmon phenomenon occurring adjacent to a metal electrode constituting the organic light emitting element. As described above, the light accounting for about 50% or more of the total light emitted from the organic light emitting element are lost in the waveguide mode and the surface plasmon mode.

Therefore, the improvement in light extraction efficiency of both of a top-emission organic light emitting display device and a bottom-emission organic light emitting display device is desirable.

A technique using a light extraction component including particles capable of scattering light has been used in order to improve light extraction efficiency. To be specific, a technique of forming the light extraction component on the front surface of a substrate has been used. However, if the light extraction component is formed on the front surface of the substrate, the light emitted from a light emitting region of a specific pixel may be extracted to the outside of the substrate through the light extraction component positioned in a region other than the light emitting region, which may cause a blurring phenomenon. Accordingly, a method for forming a light extraction component by patterning may be considered. However, a light extraction component of the related art is formed of a material which cannot be photo-patterned. Thus, an etching process for patterning the light extraction component is needed. However, during the etching process, other elements around the light extraction component may be damaged. Thus, realistically, the light extraction component cannot be patterned using techniques available thus far.

Meanwhile, the research on an organic light emitting display device employing a micro cavity structure to improve the light efficiency of the organic light emitting display device has been in progress. A micro cavity means that light is repeatedly reflected between two layers spaced from each other by an optical length, and, thus, the light having a specific wavelength is amplified through constructive interference. In a top-emission organic light emitting display device, a micro cavity is applied such that the light emitted from an organic light emitting layer is repeatedly reflected between an anode including a reflective layer and a cathode formed into a semi-transmissive layer. Further, in a bottom-emission organic light emitting display device, a micro cavity is weaker in intensity than the micro cavity of the top-emission organic light emitting display device, but can be applied for a process in which light emitted from an organic light emitting layer is reflected from a cathode.

In an organic light emitting display device employing a micro cavity as described above, a front luminance is increased. Therefore, light efficiency of the organic light emitting display device is improved, and, thus, power consumption and a life of the organic light emitting display device can also be improved. However, in the organic light emitting display device, a front view characteristic and a viewing angle characteristic are in inverse proportion to each other. Thus, an increase in front luminance results in a decrease in lateral luminance. Further, in the organic light emitting display device employing a micro cavity, the light frontally emitted from a sub-pixel is different in optical length from the light laterally emitted from the same sub-pixel. Therefore, a color shift phenomenon depending on a viewing angle may occur. Accordingly, there has been a demand for suppressing variations in luminance and color coordinate depending on a viewing angle in the organic light emitting display device employing a micro cavity.

SUMMARY OF THE INVENTION

In order to solve the above-described problems occurring when using the light extraction component of the related art, the inventors of the present disclosure invented a photosensitive resin composition for light extraction including new components capable of being photo-patterned. They also invented an organic light emitting display device having a new structure including a light scattering layer formed by using the photosensitive resin composition, and a method for manufacturing the organic light emitting display device. Further, in order to solve a decrease in luminance and a change in color coordinate depending on a viewing angle in an organic light emitting display device employing a micro cavity as described above, the inventors of the present disclosure invented an organic light emitting display device having a new structure including a light scattering layer. Furthermore, in order to suppress a blurring phenomenon between sub-pixels which may be caused by using a light scattering layer, the inventors of the present disclosure recognized that it is advantageous to perform patterning on each sub-pixel of the light scattering layer.

An objective to be achieved by the present disclosure is to provide a photosensitive resin composition for light extraction, which includes new components capable of being patterned without performing a separate etching process.

Another objective to be achieved by the present disclosure is to provide an organic light emitting display device in which a light scattering layer is formed of the new photosensitive resin composition for light extraction without damaging other elements and in which a size of the light scattering layer can be regulated, and a method for manufacturing the organic light emitting display device.

Yet another objective to be achieved by the present disclosure is to provide an organic light emitting display device increased in lifespan and decreased in power consumption by improving the efficiency of the organic light emitting display device, and a method for manufacturing the organic light emitting display device by using a simpler process.

Still another objective to be achieved by the present disclosure is to provide an organic light emitting display device in which an organic light emitting layer is decreased in thickness by using a light scattering layer. A decrease in thickness may result in a decrease in a manufacturing cost, a manufacturing time, a driving voltage, and power consumption of the organic light emitting display device, and a method for manufacturing the organic light emitting display device.

Still another objective to be achieved by the present disclosure is to provide an organic light emitting display device and a method for manufacturing the organic light emitting display device which is improved in light efficiency and also improved in power consumption and lifespan by employing a micro cavity.

Still another objective to be achieved by the present disclosure is to provide an organic light emitting display device and a method for manufacturing the same which includes a light scattering layer configured to suppress a decrease in luminance depending on a viewing angle when a micro cavity is applied.

The objectives of the present disclosure are not limited to the aforementioned objects, and other objects, which are not mentioned above, will be apparent to a person having ordinary skill in the art from the following description.

According to an aspect of the present disclosure, there is provided a photosensitive resin composition. The photosensitive resin composition includes: an alkali soluble resin; an unsaturated ethylene-based monomer; a dispersion solution for light extraction; a photopolymerization initiator; and a solvent. The dispersion solution for light extraction includes dispersion particles for light extraction and viewing angle compensation with respect to a display device. The photosensitive resin composition is formed of a photosensitive material. Thus, if a light scattering layer of an organic light emitting display device is formed by using the photosensitive resin composition, a simpler process can be used and a light scattering layer having a patterned shape can be formed.

According to another aspect of the present disclosure, there is provided an organic light emitting display device. A color filter is on a lower substrate, and an overcoating layer is on the color filter. An organic light emitting element is on the overcoating layer. The organic light emitting element includes an anode having transparent conductive layer characteristics, an organic light emitting layer on the anode, and a cathode on the organic light emitting layer. A light scattering layer is between the overcoating layer and the organic light emitting element. The light scattering layer includes dispersion particles configured to improve light extraction with respect to light emitted from the organic light emitting element and compensate a viewing angle with respect to a light emitted from the organic light emitting element. Here, it can be said that a viewing angle is "compensated or improved" if a color shift phenomenon depending on a viewing angle is reduced. The light scattering layer includes a photosensitive resin. Since the light scattering layer of the organic light emitting display device is formed of the photosensitive resin, the light scattering layer can be formed without damaging other elements and can be patterned. Thus, while the light extraction component of the related art is attached to the outer surface of a substrate, the light scattering layer of the present disclosure can be formed inside the organic light emitting display rather than outside the organic light emitting display device. Further, when the light scattering layer is used in a bottom-emission organic light emitting display device, light extraction efficiency can be improved and a viewing angle can be compensated.

According to yet another aspect of the present disclosure, there is provided an organic light emitting display device. An organic light emitting element comprises an anode including a reflective layer and a transparent conductive layer on the reflective layer, an organic light emitting layer on the anode, and a cathode on the organic light emitting layer and having semi-transmissive layer characteristics. A light scattering layer is on the cathode. The light scattering layer includes a photosensitive resin and dispersion particles dispersed in the photosensitive resin. The dispersion particles are configured to improve light extraction with respect to the light emitted from the organic light emitting element and to compensate a viewing angle with respect to a light emitted from the organic light emitting element. Since the light scattering layer of the organic light emitting display device is formed of the photosensitive resin, the other elements of the organic light emitting display device may be protected from damage while the light scattering layer is formed. Further, when the light scattering layer is used in a top-emission organic light emitting display device, light extraction efficiency can be improved and a viewing angle can be compensated.

According to an aspect of the present disclosure, there is provided a method for manufacturing an organic light emitting display device. The method for manufacturing an organic light emitting display device includes: forming a color filter on a lower substrate; forming an overcoating layer on the color filter; coating the overcoating layer with a photosensitive resin composition including an alkali soluble resin, an unsaturated ethylene-based monomer, a dispersion solution for light extraction including dispersion particles for light extraction, a photopolymerization initiator, and a solvent; forming a light scattering layer with the photosensitive resin composition by using a photo-patterning process; and forming an organic light emitting element including an anode, an organic light emitting layer, and a cathode on the light scattering layer. In the method for manufacturing an organic light emitting display device, the light scattering layer is formed using the photosensitive resin composition capable of being photo-patterned. Thus, other elements of the organic light emitting display device such as insulation layers, the organic light emitting element, and a thin film transistor are protected from damage during a manufacturing process of the light scattering layer. Further, in the method for manufacturing an organic light emitting display device, since the photosensitive resin composition can be photo-patterned, the organic light emitting display device including the light scattering layer can be manufactured by a simpler process.

Details of other exemplary embodiments will be included in the detailed description of the disclosure and the accompanying drawings.

The present disclosure can provide a photosensitive resin composition for light extraction, which includes new components capable of being photo-patterned without performing a separate etching process.

Further, the present disclosure can form a light scattering layer within an organic light emitting display device using a photosensitive resin composition for light extraction which is capable of being photo-patterned without damaging other elements. It can also provide the light scattering layer patterned into a desired size.

Furthermore, the present disclosure can increase the life of an organic light emitting display device and decrease the power consumption of the organic light emitting display device by improving the efficiency of the organic light emitting display device.

Also, since the present disclosure forms a light scattering layer using a photosensitive resin composition for light extraction which is capable of being photo-patterned, the present disclosure can provide a simpler process for forming a light scattering layer.

Moreover, the present disclosure can decrease the thickness of an organic light emitting layer and also decrease a manufacturing cost, a manufacturing time, a driving voltage, and power consumption of an organic light emitting display device by using a light scattering layer.

Further, the present disclosure can improve light efficiency of an organic light emitting display device and also improve power consumption and a life of the organic light emitting display device by applying a micro cavity to the organic light emitting display device.

Furthermore, the present disclosure can minimize a decrease in luminance according to a change in viewing angle in an organic light emitting display device. This decrease in luminance can be achieved by employing a micro cavity by using a light scattering layer configured to disperse a light emitted from an organic light emitting element.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1A:
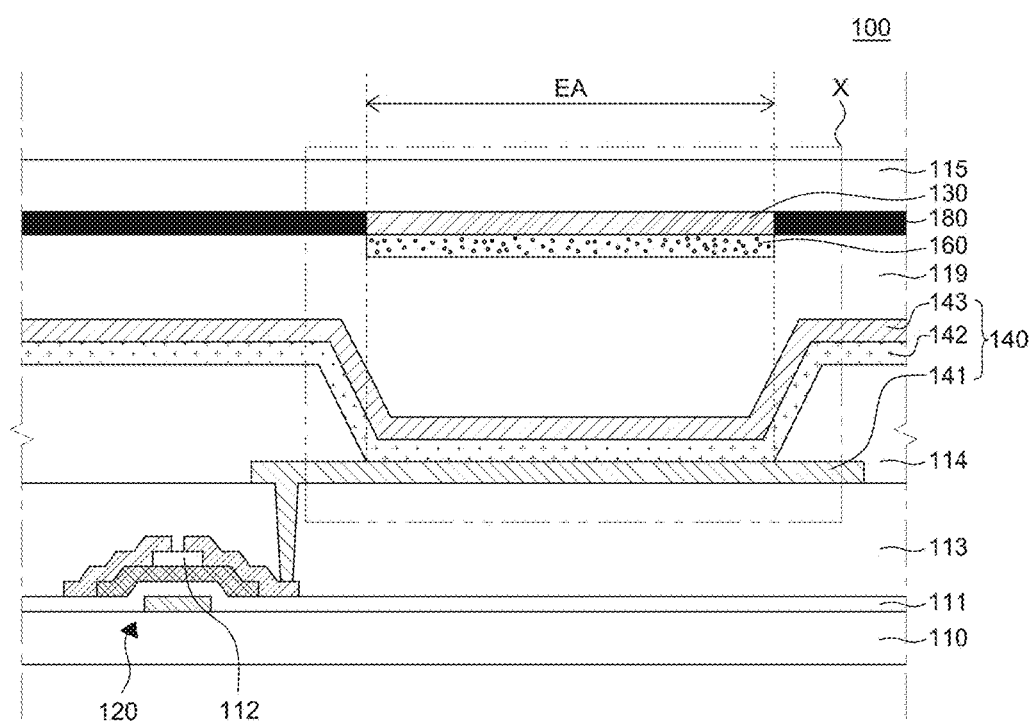
FIG. 1A is a schematic cross-sectional view provided to describe an organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

A photosensitive resin composition for light extraction according to an exemplary embodiment of the present disclosure includes: an alkali soluble resin; an unsaturated ethylene-based monomer; a dispersion solution for light extraction; a photopolymerization initiator; and a solvent. The photosensitive resin composition for light extraction according to an exemplary embodiment of the present disclosure is configured to improve light extraction efficiency of an organic light emitting display device. Also, the dispersion solution for light extraction includes dispersion particles for light extraction of the organic light emitting display device.

The alkali soluble resin is a copolymer, and may be, for example, a copolymer polymerized from one or a mixture of two or more materials selected among unsaturated carboxylic acid and unsaturated carboxylic acid anhydride; and an epoxy group-containing unsaturated compound. The alkali soluble resin accounts for 5 to 50 wt. % with respect to the total weight of the photosensitive resin composition for light extraction.

The unsaturated carboxylic acid may be acrylic acid, crotonic acid, itaconic acid, maleic acid, fumaric acid, citraconic acid, or mesaconic acid. The unsaturated carboxylic acid anhydride may be anhydride of acrylic acid, crotonic acid, itaconic acid, maleic acid, fumaric acid, citraconic acid, or mesaconic acid. However, acrylic acid or maleic acid may be used as the unsaturated carboxylic acid in consideration of copolymerization reactivity, and/or in consideration of a thermal resistance and convenience in film formation.

As the epoxy group-containing unsaturated compound, acrylic acid glycidyl ester, methacrylic acid glycidyl ester, α-ethyl acrylic acid glycidyl esters, α-n-propyl acrylic acid glycidyl ester, α-n-butyl acrylic acid glycidyl ester, acrylic acid-3,4-epoxy butyl ester, methacrylic acid-3,4-epoxy butyl ester, acrylic acid-6,7-epoxy-heptyl ester, methacrylic acid-6,7-epoxy heptyl ester, α-ethyl acrylic acid-6,7-epoxy-heptyl ester, o-vinyl benzylglycidyl ether, m-vinyl benzyl glycidyl ether, p-vinyl benzyl glycidyl ether, or combinations thereof may be used since they can increase copolymerization reactivity, a thermal resistance, and hardness.

In some exemplary embodiments, the alkali soluble resin may be a copolymer, or may be, for example, a copolymer polymerized from one or a mixture of two or more materials among unsaturated carboxylic acid and unsaturated carboxylic acid anhydride; an epoxy-containing unsaturated compound; and one or more selected from an olefin-based unsaturated carboxylic acid ester compound other than the unsaturated carboxylic acid and the unsaturated carboxylic acid anhydride, and an olefin-based unsaturated compound other than the unsaturated carboxylic acid, the unsaturated carboxylic acid anhydride, and the olefin-based unsaturated carboxylic acid ester compound. Herein, the unsaturated carboxylic acid, the unsaturated carboxylic acid anhydride, and the epoxy-containing unsaturated compound may be the same as described above.

As the olefin-based unsaturated carboxylic acid ester compound other than the unsaturated carboxylic acid and the unsaturated carboxylic acid anhydride, methacrylic acid alkyl ester such as methyl methacrylate, ethyl methacrylate, n-butyl methacrylate, sec-butyl methacrylate, and t-butyl methacrylate; acrylic acid alkyl ester such as methyl acrylate, and isopropyl acrylate; methacrylic acid cycloalkyl ester such as cyclohexyl methacrylate, 2-methyl cyclohexyl methacrylate, dicyclopentenyl methacrylate, dicyclopentenyloxyethyl methacrylate, and isobornyl methacrylate; acrylic acid cycloalkyl ester such as cyclohexyl acrylate, 2-methyl cyclohexyl acrylate, dicyclopentenyl acrylate, dicyclopentenyloxyethyl acrylate, and isoboronyl acrylate; methacrylic acid aryl ester such as pentyl methacrylate, and benzyl methacrylate; acrylic acid aryl ester such as penyl acrylate, and benzyl acrylate; dicarboxylic acid diester such as maleic acid diethyl, fumaric acid diethyl, and itaconic acid diethyl; and hydroxyalkyl ester such as 2-hydroxy ethyl methacrylate, and 2-hydroxy propyl methacrylate, may be used.

The olefin-based unsaturated compound other than the unsaturated carboxylic acid, the unsaturated carboxylic acid anhydride, and the olefin-based unsaturated carboxylic acid ester compound may be styrene, o-methyl styrene, m-methyl styrene, p-methyl styrene, vinyl toluene, p-methoxy styrene, acrylonitrile, methacrylonitrile, vinyl chloride, vinylidene chloride, acrylamide, methacryl amide, vinyl acetate, 1,3-butadiene, isoprene, 2,3-dimethyl-1,3-butadiene, and the like.

Examples of the solvent used for synthesis of the alkali soluble resin which is a copolymer may include: alcohols such as methanol, and ethanol; ethers such as tetrahydrofuran, diethylene glycol dimethyl ether, and diethylene glycol diethyl ether; and propylene glycol alkyl ether acetates such as propylene glycol methyl ether acetate, propylene glycol ethyl ether acetate, propylene glycol propyl ether acetate, and propylene glycol butyl ether acetate.

Further, as the polymerization initiator used for synthesis of the alkali soluble resin which is a copolymer, a radical polymerization initiator may be used. For example, the polymerization initiator may be azo compounds benzoyl peroxide such as 2,2'-azobisisobutyronitrile, 2,2'-azobis-(2, 4-dimethyl valeronitrile), and 2,2'-azobis-(4-methoxy-2,4-dimethyl valeronitrile); organic peroxide such as t-butyl peroxy pivalate, and 1,1'-bis-(t-butylperoxy)cyclohexane); and hydrogen peroxide. If peroxide is used as the polymerization initiator, the peroxide may be used together with a reducing agent so as to be used as a redox initiator.

The unsaturated ethylene-based monomer may be an acryl monomer having two or more unsaturated ethylene bonds. To be specific, the unsaturated ethylene-based monomer may be a multifunctional acryl monomer having two or more unsaturated ethylene bonds. A monofunctional, bifunctional, trifunctional, or higher functional (meth)acrylate may be used as the unsaturated ethylene-based monomer in consideration of favorable polymerizability, thermal resistance and surface hardness of a film to be obtained. The unsaturated ethylene-based monomer accounts for 5 to 70 wt. % with respect to the total weight of the photosensitive resin composition for light extraction.

Examples of the monofunctional (meth)acrylate to be used as the unsaturated ethylene-based monomer may include 2-hydroxy ethyl (meth)acrylate, carbitol (meth)acrylate, isobornyl (meth)acrylate, 3-methoxybutyl (meth)acrylate, 2-(meth)acryloyl oxy ethyl 2-hydroxypropyl phthalate, and the like.

Examples of the bifunctional (meth)acrylate to be used as the unsaturated ethylene-based monomer may include ethyleneglycol (meth)acrylate, 1,6-hexanediol (meth)acrylate, 1,9-nonanediol (meth)acrylate, propylene glycol (meth)acrylate, tetraethylene glycol (meth)acrylate, bisphenoxy ethylalcohol fluorene diacrylate, and the like.

The trifunctional or higher functional (meth)acrylate to be used as the unsaturated ethylene-based monomer may include trishydroxyethyl isocyanurate tri(meth)acrylate, trimethylpropane tri(meth)acrylate, pentaerythritol tri(meth)acrylate, pentaerythritol tetra(meth)acrylate, dipentaerythritol hexa(meth)acrylate, and the like.

The above-described monofunctional, bifunctional, trifunctional, or higher functional (meth)acrylates may be used alone or in combination.

The photopolymerization initiator is a compound that causes decomposition or bonding via photo-exposure and generates active species that are able to initiate the polymerization of the unsaturated ethylene-based monomer, such as radicals, anions, and cations. The photopolymerization initiator accounts for 0.5 to 20 wt. % with respect to the total weight of the photosensitive resin composition for light extraction. If the photopolymerization initiator accounts for less than 0.5 wt. % with respect to the total weight of the photosensitive resin composition for light extraction, a film to be obtained does not have a sufficient sensitivity. Thus, the film is likely to be lost during a development process, and even if the film is maintained during the development process, it is difficult to obtain the film with a sufficiently high crosslink density. Further, if the photopolymerization initiator accounts for more than 20 wt. % with respect to the total weight of the photosensitive resin composition for light extraction, a film to be obtained is likely to have low thermal resistance and planarization ability.

The photopolymerization initiator may be one of ketones such as thioxanthone, 2,4-diethyl thioxanthone, thioxanthone-4-sulfonic acid, benzophenone, 4,4'-bis(diethylamino)benzophenone, acetophenone, p-dimethylaminoacetophenone, α,α'-dimethoxyacetoxybenzophenone, 2,2'-dimethoxy-2-phetylacetophenone, p-methoxyacetophenone, 2-methyl-[4-(methylthio)phenyl]-2-morpholino-1-propanone, 2-benzyl-2-diethylamino-1-(4-morpholinophenyl)-butane-1-one, 2-hydroxy-2-methyl-1-phenylpropan-1-one, 4-(2-hydroxyethoxy)phenyl-(2-hydroxy-2-propyl)ketone, and 1-hydroxycyclohexyl phenyl ketone; quinones such as anthraquinone, and 1,4-naphthoquinone; halogen compounds such as 1,3,5-tris(trichloromethyl)-s-triazine, 1,3-bis (trichloromethyl)-5-(2-chlorophenyl)-s-triazine, 1,3-bis (trichlorophenyl)-s-triazine, phenacyl chloride, tribromomethylphenyl sulfone, and tris(trichloromethyl)-s-triazine; peroxides such as di-t-butyl peroxide; acylphosphine oxides such as 2,4,6-trimethyl benzoyl diphenyl phosphine oxide, or combinations thereof.

The solvent is an organic solvent, and accounts for 20 to 90 wt. % with respect to the total weight of the photosensitive resin composition for light extraction. Examples of the solvent may include: alcohols such as methanol, and ethanol; ethers such as tetrahydrofuran, diethylene glycol dimethyl ether, and diethylene glycol diethyl ether; and propylene glycol alkyl ether acetates such as propylene glycol methyl ether acetate, propylene glycol ethyl ether acetate, propylene glycol propyl ether acetate, and propylene glycol butyl ether acetate. Among the above-described exemplary solvents, in consideration of solubility, reactivity with each element, and convenience in film formation, ethers such as diethylene glycol dimethyl ether, diethylene glycol diethyl ether, and propylene glycol methyl ether; ketones such as methyl ethyl ketone, cyclohexanone, and 4-hydroxy-4-methyl-2-pentanone; and esters including: methyl ester, ethyl ester, propyl ester, and butyl ester of acetic acid; ethyl ester and methyl ester of 2-hydroxy-propionic acid; ethyl ester of 2-hydroxy-2-methyl propionic acid; methyl ester, ethyl ester, and butyl ester of hydroxy acetic acid; lactic acid ethyl, lactic acid propyl, and lactic acid butyl; methyl ester, ethyl ester, propyl ester, and butyl ester of methoxy acetic acid; methyl ester, ethyl ester, propyl ester, and butyl ester of propoxy acetic acid; methyl ester, ethyl ester, propyl ester, and butyl ester of butoxy acetic acid; methyl ester, ethyl ester, propyl ester, and butyl ester of 2-methoxy propionic acid; methyl ester, ethyl ester, propyl ester, and butyl ester of 2-ethoxy propionic acid; methyl ester, ethyl ester, propyl ester, and butyl ester of 2-butoxy propionic acid; methyl ester, ethyl ester, propyl ester, and butyl ester of 3-methoxy propane; methyl ester, ethyl ester, propyl ester, and butyl ester of 3-ethoxy propionic acid; methyl ester, ethyl ester, propyl ester, and butyl ester of 3-butoxy propionic acid, and the like may be used.

In some exemplary embodiments, a solvent with high boiling point may be used together with the above-described solvents. Examples of the solvent with high boiling point may include N-methyl formamide, N,N-dimethylformamide, N-methyl acetamide, N,N-dimethylacetamide, N-methylpyrrolidone, dimethyl sulfoxide, benzyl ethyl ether, and the like.

The dispersion solution for light extraction includes dispersion particles for light extraction. The dispersion solution for light extraction is used to uniformly disperse the dispersion particles within the photosensitive resin composition for light extraction, and accounts for 5 to 50 wt. % with respect to the total weight of the photosensitive resin composition for light extraction. The dispersion solution for light extraction includes the dispersion particles and further includes a binder, a dispersing agent, a solvent, and the like.

A difference in refractive index between the dispersion particle and the alkali soluble resin and a difference in refractive index between the dispersion particle and the unsaturated ethylene-based monomer are 0.2 or more. If a light scattering layer of an organic light emitting display device is formed using the photosensitive resin composition for light extraction, a predetermined difference in refractive index between the alkali soluble resin (which serves as a base member of the light scattering layer) and the dispersion particle (which is dispersed in the light scattering layer), or between the unsaturated ethylene based monomer and the dispersion particle (which is dispersed in the light scattering layer) is needed. Such predetermined difference is to scatter light emitted from the organic light emitting layer, and for example, a difference in refractive index of 0.2 or more is needed. For example, if a refractive index of the alkali soluble resin and a refractive index of the unsaturated ethylene-based monomer are in the range of 1.4 to 1.6, the dispersion particle may be a hollow particle including a metal oxide having a refractive index of 1.8 or more or a gas part having a refractive index of 1.2 or less. Examples of the metal oxide to be used in the dispersion particle may include titanium oxide ($TiO_2$), zirconium oxide (ZrO2), barium titanate ($BaTiO_3$), and the like. The hollow particle to be used as the dispersion particle may include a gas part having a refractive index of 1.2 or less and a peripheral part surrounding the gas part. The gas part may be formed of air, nitrogen, oxygen, and the like, and the peripheral part may be formed of a material having the same refractive index as the alkali soluble resin and the unsaturated ethylene-based monomer. In the present specification, when two values are the same, the two values may be completely or substantially identical to each other. That is, when the two values are the same, the two values may be substantially identical to each other in consideration of an error range, a process variation during a manufacturing process, and the like.

The dispersion particle has a diameter of 100 nm to 1 µm. For example, in order for the light scattering layer formed of a photosensitive resin composition for light extraction to further improve light extraction efficiency, the dispersion particle may have a diameter of 200 nm to 1 µm. If the dispersion particle has a diameter of less than 200 nm, the dispersion particle cannot be recognized by light. Thus, light scattering required to improve light extraction efficiency does not occur. If the dispersion particle has a diameter of more than 1 µm, a material has a low stability and a coating property of the photosensitive resin composition for light extraction deteriorates. Further, for example, in order for the light scattering layer formed of the photosensitive resin composition for light extraction to further improve a viewing angle, the dispersion particle may have a diameter of 100 nm to 700 nm. If the dispersion particle has a diameter of less than 100 nm, the dispersion particle cannot be recognized by light. Thus, an optical path of light traveling through the dispersion particle is not changed and it is difficult to improve a viewing angle. Further, if the dispersion particle has a diameter of more than 700 nm, a material has a low stability and transmissivity of the light scattering layer may be excessively decreased. Thus, a display device employing the light scattering layer may be dimly seen. Therefore, in order for the light scattering layer formed of the photosensitive resin composition for light extraction to further improve a viewing angle, the dispersion particle may have a diameter of 100 nm to 700 nm, for example, 100 nm to 200 nm. Herein, the diameter of the dispersion particle means an average diameter of the dispersion particles obtained by conducting a particle size analysis.

The photosensitive resin composition for light extraction is formed by stirring the above-described components of the photosensitive resin composition for light extraction. For example, the photosensitive resin composition for light extraction is formed by stirring the alkali soluble resin, the unsaturated ethylene-based monomer, the dispersion solution for light extraction, and the photopolymerization initiator at room temperature, and then adding the solvent with stirring at room temperature.

A light scattering layer for improving light extraction efficiency of an organic light emitting display device may be formed by using the photosensitive resin composition for light extraction according to an exemplary embodiment of the present disclosure. In this case, since the light scattering layer formed of the photosensitive resin composition for light extraction can improve light extraction efficiency of the organic light emitting display device, the life of the organic light emitting display device can be increased and power consumption of the organic light emitting display device can be reduced. Further, since the photosensitive resin composition for light extraction can be photo-patterned without performing a separate etching process, the light scattering layer can be formed of the photosensitive resin composition for light extraction by a relatively simple process. The process includes photo-exposure, and development, and the light scattering layer can be formed within the organic light emitting display device without damaging other elements. Also, the light scattering layer having a patterned shape can be formed.

As one of the other additives which can be added in addition to the above-described components of the photosensitive resin composition for light extraction, a surfactant for improving a coating property of the photosensitive resin composition for light extraction may be used. Examples of the surfactant may include a fluorine-based surfactant and a silicon-based surfactant, for example, such as FC-129, FC-170C, and FC-430 available from 3M, F-172, F-173, F-183, F-470, and F-475 available from DIC, and KP322, KP323, KP340, and KP341 available from Shin-Etsu Silicone. If the surfactant accounts for more than 5 wt. % with respect to the alkali soluble resin which is a copolymer, foam may be generated when the photosensitive resin composition for light extraction is coated. Therefore, if the surfactant is used, the surfactant may account for 5 wt. % or less and for example, 2 wt. % or less with respect to the alkali soluble resin.

As one of the other additives which can be added in addition to the above-described components of the photosensitive resin composition for light extraction, an adhesive adjuvant for improving adhesion with respect to a gas may be used. Examples of the adhesive adjuvant may include a functional silane coupling agent, for example, such as trimethoxysilyl benzoic acid, γ-methacryloxypropyltrimethoxysilanetrimethoxy silane, vinyl trimethoxy silane, vinyltrimethoxy silane, γ-isocyanatepropyltriethoxysilane, and γ-glycidoxypropyltrimethoxy silane. If the adhesive adjuvant accounts for more than 20 wt. % with respect to the alkali soluble resin which is a copolymer, a film to be obtained may have a decreased thermal resistance. Therefore, if the adhesive adjuvant is used, the adhesive adjuvant may account for 20 wt. % or less and more for example, 10 wt. % or less with respect to the alkali soluble resin.

Hereinafter, an organic light emitting display device and a method for manufacturing the same using the above-described photosensitive resin composition for light extraction will be described.

Figure 1B:
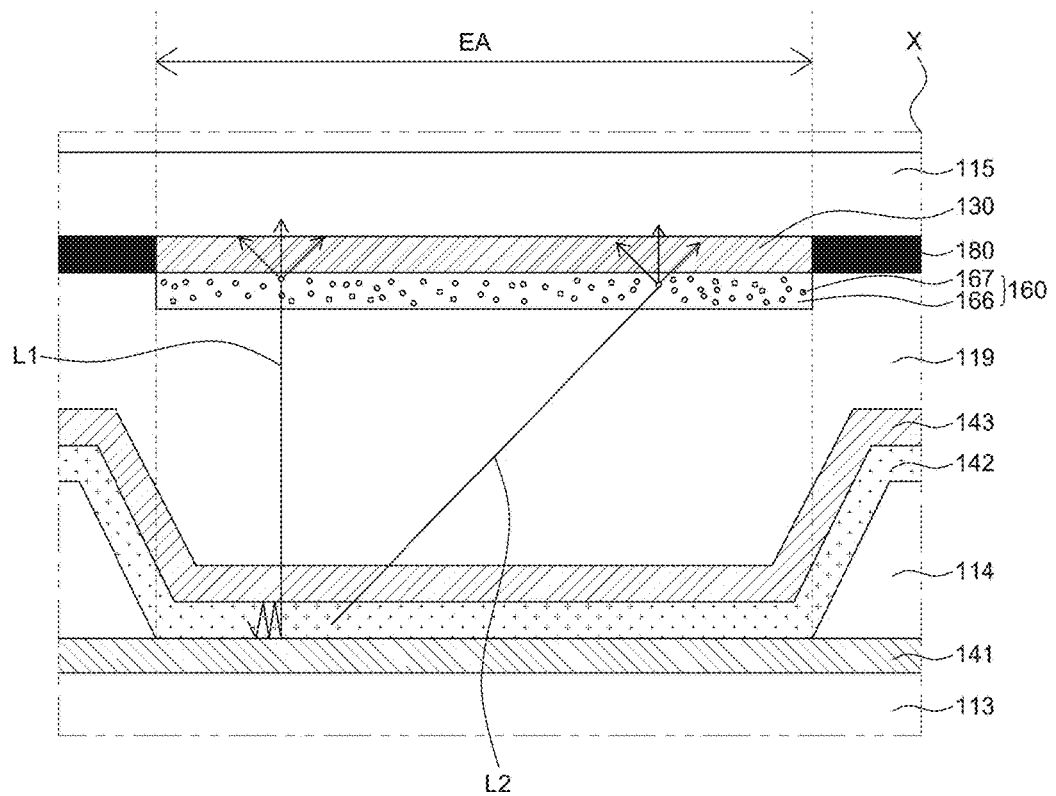
FIG. 1B is an enlarged cross-sectional view of an area X of FIG. 1A.

FIG. 1A is a cross-sectional view provided to describe an organic light emitting display device according to an exemplary embodiment of the present disclosure. FIG. 1B is an enlarged cross-sectional view of an area X of FIG. 1A. Referring to FIG. 1A and FIG. 1B, an organic light emitting display device 100 includes a lower substrate 110, a color filter 130, an overcoating layer 113, and an organic light emitting element 140, and a light scattering layer 160. The organic light emitting display device 100 illustrated in FIG. 1A and FIG. 1B is of a top-emission type. For convenience in explanation, FIG. 1A and FIG. 1B illustrate only cross-sectional views of a single sub-pixel of the organic light emitting display device 100.

Referring to FIG. 1A and FIG. 1B, a thin film transistor 120 including a gate electrode, an active layer, a source electrode, and a drain electrode is formed on the lower substrate 110 formed of an insulation material. To be specific, the gate electrode is formed on the lower substrate 110, a gate insulation layer 111 for insulating the gate electrode from the active layer is formed on the gate electrode and the lower substrate 110, the active layer is formed on the gate insulation layer 111, an etch stopper 112 is formed on the active layer, and the source electrode and the drain electrode are formed on the active layer and the etch stopper 112. The source electrode and the drain electrode are electrically connected with the active layer as being in contact with the active layer, and formed on some areas of the etch stopper 112. In the present specification, among various thin film transistors which can be included in the organic light emitting display device 100, only a driving thin film transistor is illustrated for convenience in explanation. Further, in the present specification, the thin film transistor 120 is described as having an inverted staggered structure, but a thin film transistor having a coplanar structure may also be used.

An overcoating layer 113 is formed on the thin film transistor 120. The overcoating layer 113 is formed of an insulation material, and may be formed of one of, for example, but not limited thereto, acryl-based resin, epoxy resin, phenol resin, polyamide-based resin, polyimide-based resin, unsaturated polyester-based resin, polyphenylene-based resin, polyphenylenesulfide-based resin, benzocyclobutene, and photoresist.

An organic light emitting element 140 and a bank layer 114 are formed on the overcoating layer 113. To be specific, an anode 141 for supplying holes to an organic light emitting layer 142 is formed on a top surface of the overcoating layer 113. Further, the bank layer 114 is formed so as to cover an edge of the anode 141. The organic light emitting layer 142 is formed on the anode 141, and a cathode 143 for supplying electrons to the organic light emitting layer 142 is formed on the organic light emitting layer 142.

The anode 141 may include a reflective layer and a transparent conductive layer on the reflective layer. The reflective layer of the anode 141 is formed on the overcoating layer 113 and electrically connected with the thin film transistor 120 through a contact hole formed in the overcoating layer 113. The reflective layer of the anode 141 may be formed of a metal material, for example, such as a silver alloy (Ag alloy), having excellent reflectivity. The transparent conductive layer of the anode 141 may be formed of a transparent conductive oxide (TCO), for example, such as ITO (Indium Tin Oxide) or IZO (Indium Zinc Oxide), having a high work function.

The cathode 143 is formed into a semi-transmissive layer. That is, the cathode 143 may be configured to transmit a part of light emitted from the organic light emitting layer 142 and reflect the other part toward the anode 141. To be specific, the cathode 143 may be formed of a metallic material having very small thickness and a low work function. For example, the cathode 143 may be a semi-transmissive layer formed of a metallic material such as silver (Ag), titanium (Ti), aluminum (Al), molybdenum (Mo), or an alloy of silver (Ag), and magnesium (Mg) with a thickness of several hundred Å or less.

The organic light emitting layer 142 is a white organic light emitting layer for emitting white light. The organic light emitting layer 142 may have a stack structure for emitting white light, and may be formed to have a single-stack structure or a multi-stack structure.

A micro cavity effect or structure is related to light being repeatedly reflected between two layers spaced from each other by an optical length, and, thus, light having a specific wavelength is amplified through constructive interference. As illustrated in FIG. 1A and FIG. 1B, if the organic light emitting display device 100 is a top-emission organic light emitting display device, the light L1 emitted toward the anode 141 among lights emitted from the organic light emitting layer 142 is reflected at the anode 141 and travels toward the cathode 143. Further, light emitted from the organic light emitting layer 142 toward the cathode 143 and the light L1 reflected at the anode 141 travel toward the cathode 143 which is a semi-transmissive layer. A part of such light is released to the outside and the other part is reflected and travels again toward the anode 141. Therefore, light L1 being repeatedly reflected between the anode 141 and the cathode 143 is generated, and light having a specific wavelength may be amplified through constructive interference on the basis of a distance between the anode 141 and the cathode 143, i.e., a distance between a reflective portion of the anode 141 and a reflective portion of the cathode 143. In the present specification, for convenience in explanation, it is illustrated that the light L1 emitted from the organic light emitting layer 142 is reflected at a top surface of the anode 141 and a bottom surface of the cathode 143. To be more specific, however, the light L1 emitted from the organic light emitting layer 142 may also be reflected at a top surface of the reflective layer of the anode 141 and the bottom surface of the cathode 143.

Since light emitted from each sub-pixel has a different wavelength, a resonance distance needs to be set for each wavelength of light emitted from each sub-pixel in order to realize a micro cavity. A resonance distance may be set to a value corresponding to a multiple of a half-wave length of an emitted light. As such, if a resonance distance for a light having a specific wavelength is formed, light having the specific wavelength among emitted lights is repeatedly reflected between the anode 141 and the cathode 143 and extracted to the outside as being increased in amplitude due to constructive interference. On the other hand, light having a different wavelength is repeatedly reflected between the anode 141 and the cathode 143 and extracted to the outside as being decreased in amplitude due to destructive interference. Therefore, a micro cavity is realized, so that light efficiency of the light having the specific wavelength corresponding to the resonance distance can be improved.

In order to differently set a resonance distance for each sub-pixel, the thickness of the organic light emitting layer 142 may be determined. That is, the thickness of the organic light emitting layer 142 may be defined on the basis of a resonance distance of a sub-pixel corresponding thereto. A resonance distance set for each sub-pixel will be described in detail later with reference to FIG. 2A and FIG. 2B.

The color filter 130 is disposed on a bottom surface of an upper substrate 115 formed of an insulation material. The color filter 130 is configured to convert a color of light emitted from the organic light emitting layer 142, and may be one of a red color filter, a green color filter, and a blue color filter.

The color filter 130 is formed on the bottom surface of the upper substrate 115 at a position corresponding to a light emitting region EA. Herein, the light emitting region EA refers to a region in which the organic light emitting layer 142 emits light by using the anode 141 and the cathode 143 and which corresponds to a region of the anode 141 not covered by the bank layer 114. The color filter 130 is formed at the position corresponding to the light emitting region EA, which means that the color filter 130 is disposed so as to suppress a blurring phenomenon and a ghost phenomenon caused by mixing of lights emitted from adjacent light emitting regions. For example, the color filter 130 may be formed so as to be overlapped with the light emitting region EA, as illustrated in FIG. 1A and FIG. 1B. However, a position and a size of the color filter 130 can be determined by various factors including not only a size and a position of the light emitting region EA but also a distance between the color filter 130 and the cathode 143.

A black matrix 180 is formed on the bottom surface of the upper substrate 115. The black matrix 180 may be formed at a portion of the bottom surface of the upper substrate 115 where the color filter 130 is not formed. For example, the black matrix 180 may be formed at any region other than the light emitting region EA. Although FIG. 1A and FIG. 1B illustrate that the organic light emitting display device 100 includes the black matrix 180, the black matrix 180 may be omitted.

The light scattering layer 160 is formed on a bottom surface of the color filter 130, and the upper substrate 115 and the lower substrate 110 are bonded to each other by an adhesive layer 119. That is, in a state where the upper substrate 115 and the lower substrate 110 are bonded to each other by the adhesive layer 119, the light scattering layer 160 is disposed on the cathode 143 and the color filter 130 is disposed on the light scattering layer 160.

The light scattering layer 160 is formed of the above-described photosensitive resin composition for light extraction. The light scattering layer 160 includes dispersion particles 167 and a photosensitive resin 166 for light extraction of a light emitted from the organic light emitting layer 142. The dispersion particles 167 in the light scattering layer 160 are the same as dispersion particles 167 in the photosensitive resin composition for light extraction. Further, the photosensitive resin 166 in the light scattering layer 160 may include the alkali soluble resin and the unsaturated ethylene-based monomer in the photosensitive resin composition for light extraction.

The light scattering layer 160 may have a transmissivity of 30% or more, for example, 60% or more. Since the organic light emitting display device 100 according to an exemplary embodiment of the present disclosure is a top-emission organic light emitting display device, the light emitted from the organic light emitting element 140 travels toward the upper substrate 115. However, as illustrated in FIG. 1A and FIG. 1B, the light scattering layer 160 is disposed between the cathode 143 and the upper substrate 115, so that the light scattering layer 160 may cause a decrease in transmissivity. Thus, the light scattering layer 160 of the organic light emitting display device 100 according to an exemplary embodiment of the present disclosure may have a transmissivity of 30% or more, for example, 60% or more.

The light scattering layer 160 may have a thickness of 1 μm or less, for example, 0.5 μm or less. Efforts are being made to produce an organic light emitting display device having minimal thickness. However, since the organic light emitting display device 100 according to an exemplary embodiment of the present disclosure additionally includes the light scattering layer 160, an increase in thickness of the organic light emitting display device 100 may be inevitable. Further, if the light scattering layer 160 has excessively large thickness, it may be difficult to obtain a transmissivity of the light scattering layer 160 as described above. Therefore, in order to provide a relatively thin organic light emitting display device 100 and also obtain the desired transmissivity of the light scattering layer 160, the light scattering layer 160 may have a thickness of 1 μm or less, for example, 0.5 μm or less.

The photosensitive resin 166 includes an alkali soluble resin and an unsaturated ethylene-based monomer.

The alkali soluble resin is a copolymer and is identical with the alkali soluble resin used in the above-described photosensitive resin composition for light extraction. The alkali soluble resin accounts for 10 wt. % to 50 wt. % with respect to the total weight of the light scattering layer 160.

The unsaturated ethylene-based monomer is an acryl monomer having two or more unsaturated ethylene bonds and is identical with the unsaturated ethylene-based monomer used in the above-described photosensitive resin composition for light extraction. The unsaturated ethylene-based monomer accounts for 10 wt. % to 50 wt. % with respect to the total weight of the light scattering layer 160.

The dispersion particles 167 in the light scattering layer 160 are elements for improving light extraction efficiency for a light emitted from the organic light emitting element 140. The dispersion particles 167 compensate a viewing angle, and disperse light emitted from the organic light emitting element 140. The dispersion particles 167 account for 5 wt. % to 50 wt. % with respect to the total weight of the light scattering layer 160, for example, 10 wt. % to 30 wt. % with respect to the total weight of the light scattering layer 160. If the dispersion particles 167 have a wt. % of lower than 5, an optical path of light emitted from the organic light emitting element 140 may not be sufficiently changed in the dispersion particles 167. Further, if the dispersion particles 167 have a wt. % of higher than 50, it may be difficult to obtain a transmissivity of the light scattering layer 160 as described above. Even when the organic light emitting display device 100 is turned off, external light reflection or external light dispersion may occur, the organic light emitting display device 100 may still appear to be dimly lit. Therefore, the dispersion particles 167 may account for 5 wt. % to 50 wt. % with respect to the total weight of the light scattering layer 160, for example, 10 wt. % to 30 wt. % with respect to the total weight of the light scattering layer 160. Thus, it is possible to minimize external light reflection or external light dispersion, and the use of a polarizing plate for reducing external light reflection of the organic light emitting display device 100 may not be demanded.

A difference in refractive index between the dispersion particle 167 and the alkali soluble resin and a difference in refractive index between the dispersion particle 167 and the unsaturated ethylene-based monomer are 0.2 or more. In order for the light scattering layer 160 to change an optical path of light emitted from the organic light emitting element 140, a predetermined difference in refractive index is needed. A predetermined difference in refractive index between the alkali soluble resin and the unsaturated ethylene-based monomer, serving as the photosensitive resin 166 of the light scattering layer 160, and the dispersion particle 167 in the light scattering layer 160 is needed, and may be, for example, 0.2 or more. For example, if the alkali soluble resin and the unsaturated ethylene-based monomer have refractive indexes in a range of 1.4 to 1.6, the dispersion particle 167 may be a hollow particle including a metal oxide having a refractive index of 1.8 or more or a gas part having a refractive index of 1.2 or less. To be specific, the material of the dispersion particle 167 in the light scattering layer 160 is the same as the material of the dispersion particle 167 in the photosensitive resin composition for light extraction.

The dispersion particle 167 has a diameter of 100 nm to 1 μm. For example, in order for the light scattering layer 160 to further improve light extraction efficiency of the organic light emitting display device 100, the dispersion particle 167 may have a diameter of 200 nm to 1 μm. If the dispersion particle 167 has a diameter of less than 200 nm, the dispersion particle 167 cannot be recognized by light. Thus, light scattering required to improve light extraction efficiency does not occur or may not occur properly. If the dispersion particle 167 has a diameter of more than 1 μm, a material has a low stability and a coating property of the photosensitive resin composition for light extraction deteriorates. Further, for example, in order for the light scattering layer 160 to further improve a viewing angle of the organic light emitting display device 100, the dispersion particle 167 may have a diameter of 100 nm to 700 nm. If the dispersion particle 167 has a diameter of less than 100 nm, the dispersion particle cannot be recognized by light. Thus, an optical path of a light traveling through the dispersion particle 167 is not changed and it is difficult to improve a viewing angle. Further, if the dispersion particle 167 has a diameter of more than 700 nm, a material has a low stability and transmissivity of the light scattering layer 160 may be excessively decreased. Thus, the organic light emitting display device 100 employing the light scattering layer 160 may be dimly seen. Therefore, in order for the light scattering layer 160 to further improve a viewing angle, the dispersion particle 167 may have a diameter of 100 nm to 700 nm, for example, 100 nm to 200 nm.

In some exemplary embodiments, the photosensitive resin 166 in the light scattering layer 160 may further include the polymerization initiator of the photosensitive resin composition for light extraction. That is, if the polymerization initiator remains during a photo-exposure process for forming the light scattering layer 160 using the photosensitive resin composition for light extraction, the photosensitive resin 166 may further include the polymerization initiator.

Referring to FIG. 1A to FIG. 1B, in the organic light emitting display device 100 according to an exemplary embodiment of the present disclosure, light extraction efficiency of the organic light emitting display device 100 is improved by using the light scattering layer 160 including the dispersion particles 167 for light extraction. That is, among lights emitted from the organic light emitting layer 142, the light L2 incident to the light scattering layer 160 is scattered by the dispersion particles 167. The light L2 scattered by the dispersion particles 167 in the light scattering layer 160 may travel in various directions within the light scattering layer 160. Also, the light L2 emitted from the organic light emitting layer 142 and incident into the light scattering layer 160 is highly likely to travel to the color filter 130 by the dispersion particles 167. Therefore, an amount of light travelling to the color filter 130 is increased, which may result in an increase in light extraction efficiency of the organic light emitting display device 100, an increase in life of the organic light emitting display device 100, and a decrease in power consumption of the organic light emitting display device 100.

Further, in the organic light emitting display device 100 according to an exemplary embodiment of the present disclosure, since the light scattering layer 160 is formed by using the above-described photosensitive resin composition for light extraction, an etching process is not required when the light scattering layer 160 is formed. Further, since the photosensitive resin composition for light extraction can be photo-patterned, other elements around the light scattering layer 160 are protected from damage even when the light scattering layer 160 is patterned as well as when the light scattering layer 160 is formed. Therefore, the light scattering layer 160 may be formed within the organic light emitting display device 100 without damaging the other elements of the organic light emitting display device 100. Further, by using the light scattering layer 160 having a patterned shape, i.e., by using the light scattering layer 160 which is patterned and overlapped with the light emitting region EA, it is possible to solve the problems of, i.e., the non-uniformity in luminance and the blurring phenomenon, which may be caused by the light scattering layer 160.

A viewing angle improvement effect of the organic light emitting display device 100 according to an exemplary embodiment of the present disclosure will be described with reference to FIG. 1C.

Figure 1C:
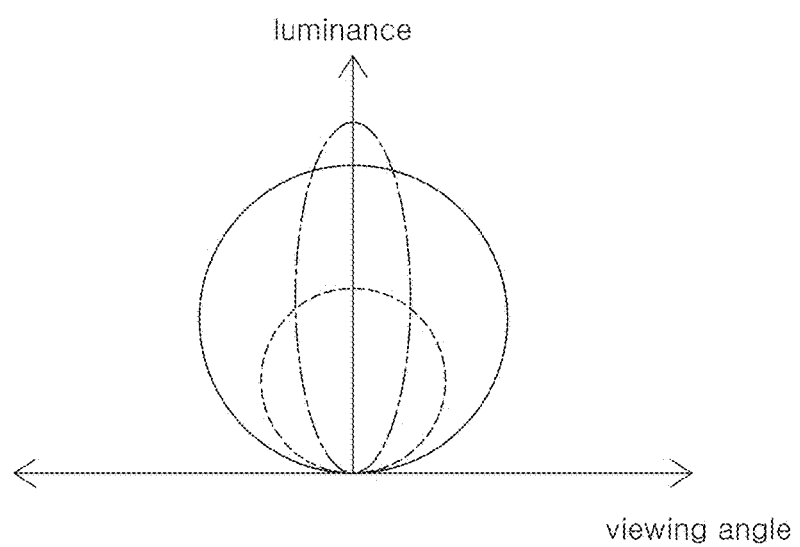
FIG. 1C is a graph of a luminance distribution depending on a viewing angle, which is provided to describe an effect of the organic light emitting display device according to an exemplary embodiment of the present disclosure.

FIG. 1C is a graph of a luminance distribution depending on a viewing angle, which is provided to describe an effect of the organic light emitting display device according to an exemplary embodiment of the present disclosure. A dotted line in FIG. 1C indicates a luminance distribution depending on a viewing angle of a top-emission organic light emitting display device in which a micro cavity is not realized. An alternate long and short dashed line indicates a luminance distribution depending on a viewing angle of a top-emission organic light emitting display device in which a micro cavity is realized. Also, a solid line indicates a luminance distribution depending on a viewing angle of a top-emission organic light emitting display device in which a micro cavity is realized. Further, a solid line indicates the light scattering layer 160 in the same manner as the organic light emitting display device 100 according to an exemplary embodiment of the present disclosure.

In the organic light emitting display device 100 according to an exemplary embodiment of the present disclosure, the anode 141 of the organic light emitting element 140 includes a reflective layer and a transparent conductive layer on the reflective layer. The cathode 143 of the organic light emitting element 140 includes a semi-transmissive layer. Further, in order to realize a micro cavity, thickness of the organic light emitting layer 142 in each sub-pixel may be determined on the basis of a resonance distance. Therefore, the light L1 emitted from the organic light emitting layer 142 is repeatedly reflected between the anode 141 and the cathode 143 and then travels toward the upper substrate 115 through the cathode 143. Therefore, a micro cavity is realized in the organic light emitting display device 100, and light efficiency is increased. Therefore, power consumption of the organic light emitting display device 100 may be decreased and a life of the organic light emitting display device 100 may be increased.

However, as illustrated in FIG. 1C, it can be seen that in the organic light emitting display device in which a micro cavity is realized, a front luminance is increased but a lateral luminance is decreased, as compared with the organic light emitting display device in which a micro cavity is not realized. Therefore, when a lateral luminance is decreased, there is a problem with a viewing angle that the organic light emitting display device seems to have a low luminance in a side view thereof. Further, there may also be a problem as screens of the same color are seen with different color coordinates depending on a viewing angle.

In this regard, in the organic light emitting display device 100 according to an exemplary embodiment of the present disclosure, the light scattering layer 160 is disposed between the cathode 143 and the upper substrate 115 and configured to solve the above-described problems with respect to viewing angle. To be specific, as illustrated in FIG. 1B, the light L1 emitted from the organic light emitting element 140 travels toward the light scattering layer 160 and meets the dispersion particle 167 in the light scattering layer 160, so that an optical path of the light L1 is changed. That is, in the organic light emitting display device 100 according to an exemplary embodiment of the present disclosure, a micro cavity may cause the light extracted from the organic light emitting element 140 to be dispersed through the light scattering layer 160. Resultantly, a front luminance of the organic light emitting display device 100 may be increased and a lateral luminance of the organic light emitting display device 100 may also be increased, as illustrated in FIG. 1C.

In some exemplary embodiments, the organic light emitting layer 142 may be one of a red organic light emitting layer, a green organic light emitting layer, and a blue organic light emitting layer. If the organic light emitting layer 142 emits one of a red light, a green light, and a blue light, the color filter 130 may not be an essential component. However, if the light scattering layer 160 is used without using the color filter 130, the dispersion particles 167 in the light scattering layer 160 may cause a so-called bleeding effect of a color of light emitted from the organic light emitting element 140. Therefore, in order to realize colors more clearly and realistically, even when the organic light emitting layer 142 is one of a red organic light emitting layer, a green organic light emitting layer, and a blue organic light emitting layer, the color filter 130 may be used.

Figure 2A:
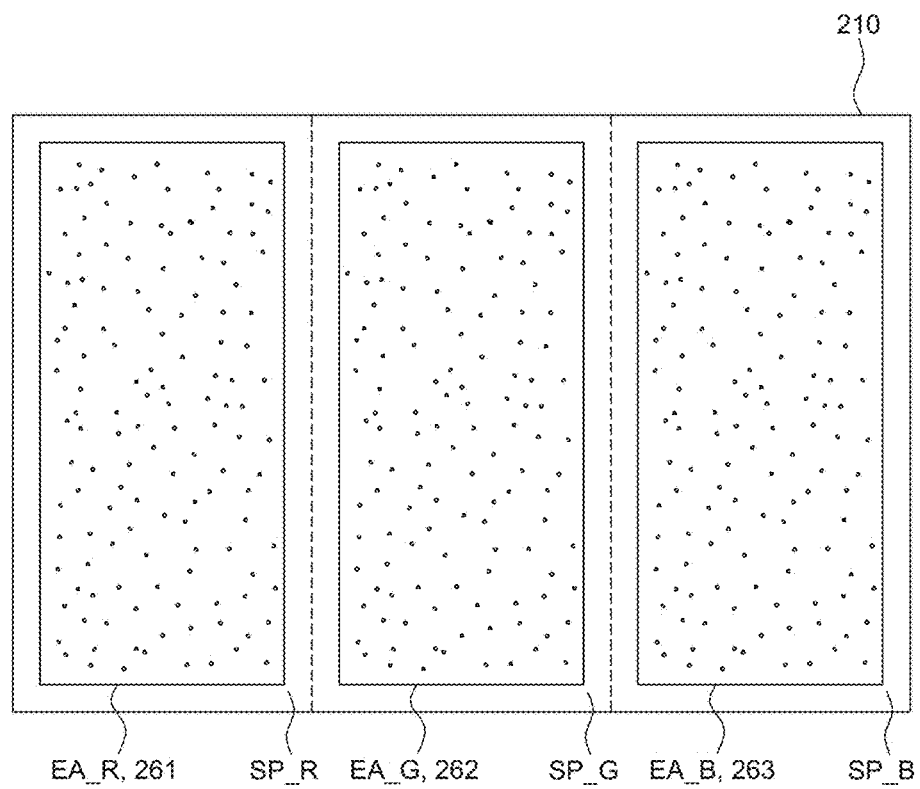
FIG. 2A is a schematic plan view provided to describe an organic light emitting display device according to another exemplary embodiment of the present disclosure.
Figure 2B:
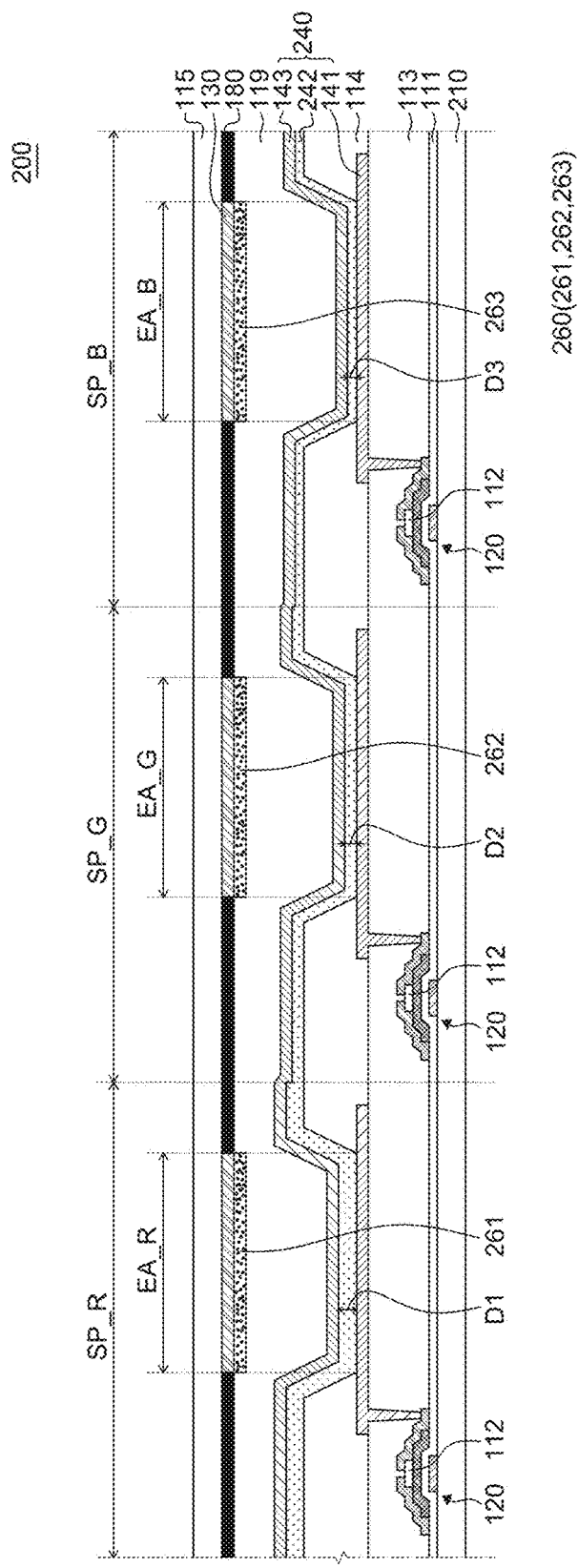
FIG. 2B is a schematic cross-sectional view provided to describe the organic light emitting display device according to another exemplary embodiment of the present disclosure.

FIG. 2A is a schematic plan view provided to describe an organic light emitting display device according to another exemplary embodiment of the present disclosure. FIG. 2B is a schematic cross-sectional view provided to describe the organic light emitting display device according to another exemplary embodiment of the present disclosure. An organic light emitting display device 200 illustrated in FIG. 2A and FIG. 2B is substantially the same as the organic light emitting display device 100 illustrated in FIG. 1A and FIG. 1B except that the organic light emitting display device 200 includes three sub-pixels SP_R, SP_G, and SP_B and the thickness of an organic light emitting layer 242 in each sub-pixel is different from each other. Therefore, redundant description thereof will be omitted. For convenience in explanation, FIG. 2A illustrates only a lower substrate 210 and a light scattering layer 260.

Referring to FIG. 2A and FIG. 2B, a plurality of sub-pixels SP_R, SP_G, and SP_B is defined in the lower substrate 210. To be specific, the lower substrate 210 includes a red sub-pixel SP_R, a green sub-pixel SP_G, and a blue sub-pixel SP_B. In some exemplary embodiments, the lower substrate 210 may further include a white sub-pixel, or the color filter 130 may not be disposed on the white sub-pixel.

The sub-pixels SP_R, SP_G, and SP_B include light emitting regions EA_R, EA_G, and EA_B, respectively. To be specific, the red sub-pixel SP_R includes a red light emitting region EA_R, the green sub-pixel SP_G includes a green light emitting region EA_G, and the blue sub-pixel SP_B includes a blue light emitting region EA_B.

The organic light emitting element 240 is disposed on each of the sub-pixels SP_R, SP_G, and SP_B. Herein, thicknesses D1, D2, and D3 of the organic light emitting layers 242 in the respective sub-pixels SP_R, SP_G, and SP_B may be different from one another. That is, the thicknesses D1, D2, and D3 of the organic light emitting layers 242 may be set for the respective sub-pixels SP_R, SP_G, and SP_B in order to realize a micro cavity.

To be more specific, lights emitted from the respective sub-pixels SP_R, SP_G, and SP_B are different from one another in wavelength. Thus, in order to realize a micro cavity, resonance distances need to be set for wavelengths of lights emitted from the respective sub-pixels SP_R, SP_G, and SP_B. A resonance distance may be set to a value corresponding to a multiple of a half-wave length of emitted light. Since a red visible light, a green visible light, and a blue visible light are different from one another in wavelength, a resonance distance needs to be differently set for each of the red sub-pixel SP_R, the green sub-pixel SP_G, and the blue sub-pixel SP_B. For example, since the red visible light has a wavelength of about 620 nm, a resonance distance for the red sub-pixel SP_R needs to be set to a multiple of about 310 nm. Therefore, the thickness D1 of the organic light emitting layer 242 corresponding to a distance between the anode 141 and the cathode 143 in the red sub-pixel SP_R may be set to a multiple of about 310 nm. Further, since the green visible light has a wavelength of about 530 nm, a resonance distance for the green sub-pixel SP_G needs to be set to a multiple of about 265 nm. Therefore, the thickness D2 of the organic light emitting layer 242 in the green sub-pixel SP_G may be set to a multiple of about 265 nm. Furthermore, since the blue visible light has a wavelength of about 460 nm, a resonance distance for the blue sub-pixel SP_B needs to be set to a multiple of about 230 nm. Therefore, the thickness D3 of the organic light emitting layer 242 in the blue sub-pixel SP_B may be set to a multiple of about 230 nm.

In some exemplary embodiments, if light emitted from the organic light emitting layer 242 is defined as being reflected at the top surface of the reflective layer of the anode 141 and the bottom surface of the cathode 143, the sum of the thickness D1 of the organic light emitting layer 242 and a thickness of the transparent conductive layer in the red sub-pixel SP_R may be set to a multiple of about 310 nm, the sum of the thickness D2 of the organic light emitting layer 242 and the thickness of the transparent conductive layer in the green sub-pixel SP_G may be set to a multiple of about 265 nm. Also, the sum of the thickness D3 of the organic light emitting layer 242 and the thickness of the transparent conductive layer in the blue sub-pixel SP_B may be set to a multiple of about 230 nm.

Referring to FIG. 2A and FIG. 2B, the light scattering layer 260 includes a plurality of sub-light scattering layers 261, 262, and 263 divided for the plurality of sub-pixels SP_R, SP_G, and SP_B, respectively. To be specific, the light scattering layer 260 includes a first sub-light scattering layer 261 corresponding to the red sub-pixel SP_R, a second sub-light scattering layer 262 corresponding to the green sub-pixel SP_G, and a third sub-light scattering layer 263 corresponding to the blue sub-pixel SP_B. The first sub-light scattering layer 261 is disposed so as to be overlapped with the color filter 130 disposed on the red sub-pixel SP_R. The second sub-light scattering layer 262 is disposed so as to be overlapped with the color filter 130 disposed on the green sub-pixel SP_G. Further, the third sub-light scattering layer 263 is disposed so as to be overlapped with the color filter 130 disposed on the blue sub-pixel SP_B.

Referring to FIG. 2A and FIG. 2B, the light emitting regions EA_R, EA_G, and EA_B and the sub-light scattering layers 261, 262, and 263 disposed on the respective light emitting regions EA_R, EA_G, and EA_B are overlapped so as to correspond to each other. That is, the areas of the light emitting regions EA_R, EA_G, and EA_B may be the same as the areas of the sub-light scattering layers 261, 262, and 263 disposed on the respective light emitting regions EA_R, EA_G, and EA_B. Herein, the area of a specific component is defined as a bigger one of an area of a top surface and an area of a bottom surface of the specific component. For example, the area of the first sub-light scattering layer 261 disposed on the red sub-pixel SP_R is greater than the area of the red light emitting region EA_R. Light dispersion occurring in the first sub-light scattering layer 261 may cause a blurring phenomenon in a periphery of the red light emitting region EA_R. Therefore, in the organic light emitting display device 200 according to another exemplary embodiment of the present disclosure, since the light emitting regions EA_R, EA_G, and EA_B and the sub-light scattering layers 261, 262, and 263 disposed on the respective light emitting regions EA_R, EA_G, and EA_B are overlapped with each other, it is possible to solve a blurring phenomenon as described above.

Further, if the first sub-light scattering layer 261 disposed on the red light emitting region EA_R is formed so as to be overlapped with the green light emitting region EA_G on the green sub-pixel SP_G or the blue light emitting region EA_B on the blue sub-pixel SP_B adjacent to the red sub-pixel SP_R, a color mixing phenomenon may occur. Therefore, in the organic light emitting display device 200 according to another exemplary embodiment of the present disclosure, since each of the sub light-scattering layers 261, 262, and 263 is formed so as to be overlapped with only one of the plurality of light emitting regions EA_R, EA_G, and EA_B, it is possible to suppress an occurrence of a color mixing phenomenon.

In some exemplary embodiments, the light scattering layer 260 may be formed into a single layer throughout a plurality of sub-pixels. That is, the light scattering layer 260 may be formed into a single layer throughout the red sub-pixel SP_R, the green sub-pixel SP_G, and the blue sub-pixel SP_B rather than being formed into a plurality of sub-light scattering layers 260.

Figure 3A:
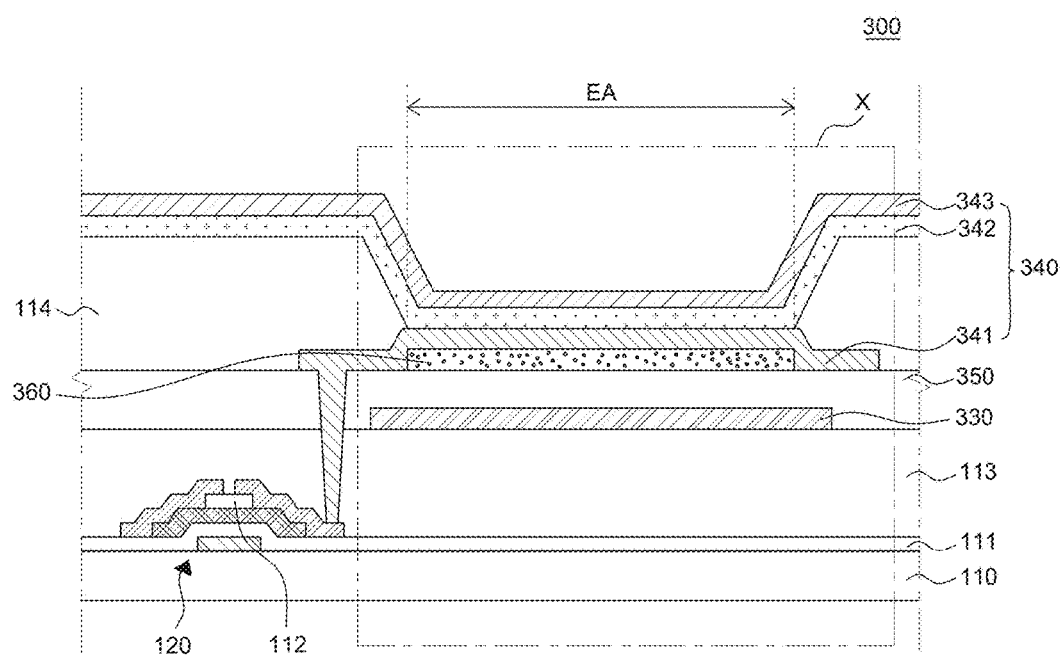
FIG. 3A is a schematic cross-sectional view provided to describe an organic light emitting display device according to yet another exemplary embodiment of the present disclosure.
Figure 3B:
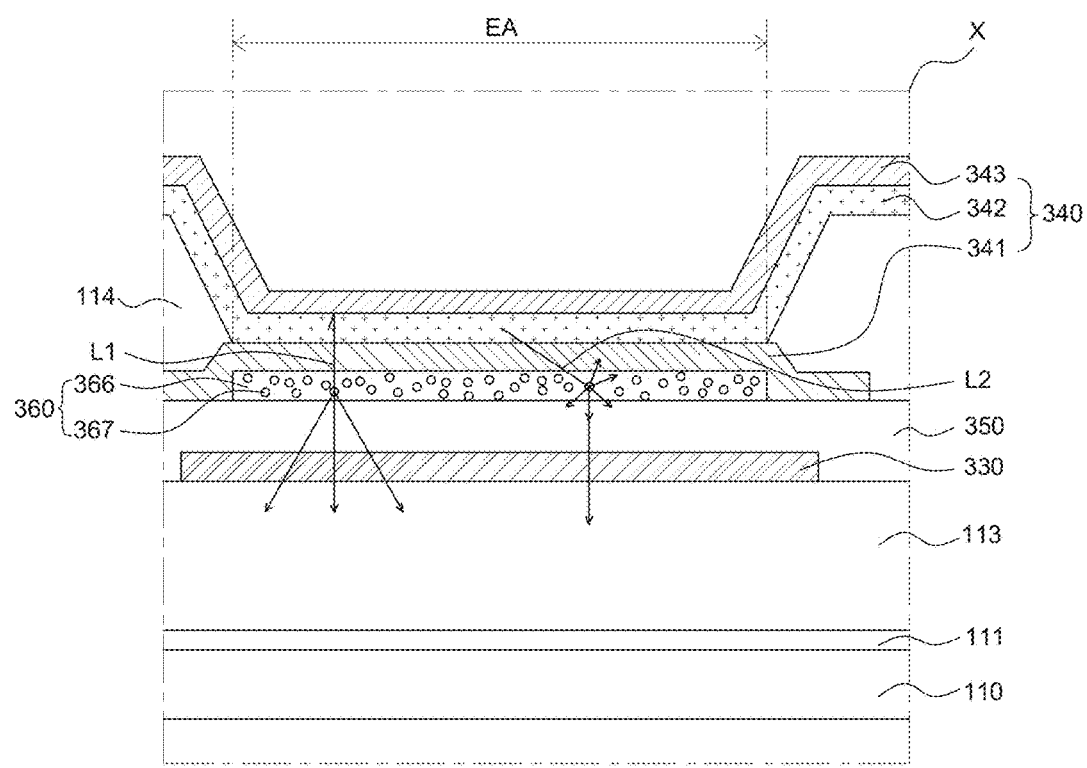
FIG. 3B is an enlarged cross-sectional view of an area X of FIG. 3A.

FIG. 3A is a schematic cross-sectional view provided to describe an organic light emitting display device according to yet another exemplary embodiment of the present disclosure. FIG. 3B is an enlarged cross-sectional view of an area X of FIG. 3A. An organic light emitting display device 300 illustrated in FIG. 3A and FIG. 3B is substantially the same as the organic light emitting display device 100 illustrated in FIG. 1A and FIG. 1B except that the organic light emitting display device 300 is changed to a bottom-emission organic light emitting display device. Thus, a configuration of an organic light emitting element 340 is changed and positions of a color filter 330 and a light scattering layer 360 are changed. Also, the organic light emitting display device 300 further includes an additional overcoating layer 350, and the adhesive layer 119, the upper substrate 115, and the black matrix 180 are omitted. Therefore, redundant description thereof will be omitted.

Referring to FIG. 3A, the overcoating layer 113 is formed on the thin film transistor 120, and the color filter 330 is formed on the overcoating layer 113. The color filter 330 is configured to convert a color of a light emitted from an organic light emitting layer 342, and may be one of a red color filter, a green color filter, and a blue color filter, or combination thereof. The color filter 330 may be formed of a material having a refractive index of about 1.5. The color filter 330 is formed on the overcoating layer 113 at a position corresponding to the light emitting region EA.

An additional overcoating layer 350 can be formed on the color filter 330 and the overcoating layer 113. The additional overcoating layer 350 may be formed of the same material as the overcoating layer 113. Further, the additional overcoating layer 350 may be formed of an insulation material having a refractive index of about 1.5.

The light scattering layer 360 is formed so as to be overlapped with the color filter 330. That is, the light scattering layer 360 is not formed on the entire region of the lower substrate 110, but the entire light scattering layer 360 is formed on the color filter 330. Details of an overlap relationship between the light scattering layer 360 and the color filter 330 will be described later with reference to FIG. 3C.

The organic light emitting element 340 including an anode 341, an organic light emitting layer 342, and a cathode 343 and the bank 114 are formed on the additional overcoating layer 350 and the light scattering layer 360. To be more specific, the anode 341 for supplying holes to the organic light emitting layer 342 is formed on top surfaces of the additional overcoating layer 350 and the light scattering layer 360. The organic light emitting layer 342 is formed on the anode 341, and the cathode 343 for supplying electrons to the organic light emitting layer 342 is formed on the organic light emitting layer 342. The anode 341 is formed of a material having a high work function, and the cathode 343 is formed of a low work function. The organic light emitting layer 342 is configured to emit white light. In the present specification, since the organic light emitting display device 300 is of a bottom-emission type, the material constituting the cathode 343 may have an excellent reflectivity.

The organic light emitting element 340 includes the light emitting region EA defined by the bank 114. That is, in the anode 341 of the organic light emitting element 340, only a portion of the anode 341 which is not covered by the bank 114 can emit light. Thus, in the organic light emitting element 340, the portion of the anode 341 which is not covered by the bank 114 functions as the light emitting region EA.

The light emitting region EA is overlapped with the light scattering layer 360. Details of an overlap relationship between the light emitting region EA and the light scattering layer 360 will be described with reference to FIG. 3C.

Figure 3C:
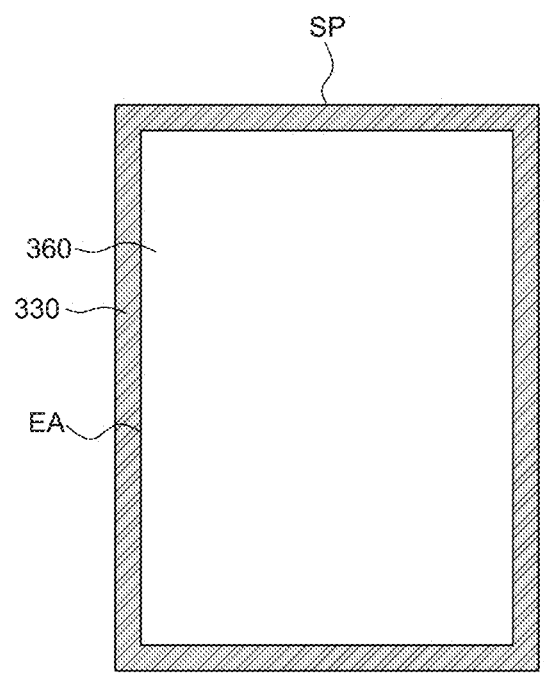
FIG. 3C is a schematic plan view provided to describe a light emitting region, a light scattering layer, and a color filter of the organic light emitting display device according to yet another exemplary embodiment of the present disclosure.

FIG. 3C is a schematic cross-sectional view provided to describe a light emitting region, a light scattering layer, and a color filter of the organic light emitting display device according to an exemplary embodiment of the present disclosure. For convenience in explanation, FIG. 3C illustrates only a plan view of the light emitting region EA, the light scattering layer 360, and the color filter 330 of a single sub-pixel SP when viewed from the top of the organic light emitting display device 300. In FIG. 3C, the light emitting region EA and the light scattering layer 360 are illustrated without being shaded or hatched, and the color filter 330 is illustrated as corresponding to the entire inner region surrounded by the outermost solid line and only a portion of the color filter 330 which is not overlapped with the light scattering layer 360 is hatched in the same manner as FIG. 3A and FIG. 3B.

Referring to FIG. 3C, the light emitting region EA and the light scattering layer 360 are overlapped so as to correspond to each other. That is, the light emitting region EA may have the same area as the light scattering layer 360. Herein, an area of a specific component is defined by a bigger one of an area of a top surface and an area of a bottom surface of the specific component. The anode 341 has a step caused by the light scattering layer 360 and the overcoating layer 350. Further, in a portion of the anode 341 including a step, the organic light emitting element 340 may deteriorate. Thus, if the light scattering layer 360 has a smaller area than the light emitting region EA, the portion of the anode 341 including a step, i.e., a portion of the anode 341 positioned on a boundary of the light scattering layer 360, may be disposed in the light emitting region EA. Also, the deterioration of the organic light emitting element 340 may cause non-uniformity in luminance in the light emitting region EA. Even if the organic light emitting element 340 does not deteriorate, there may be non-uniformity in luminance between a portion of the light emitting region EA which is improved in light extraction efficiency since the light scattering layer 360 is formed and a portion of the light emitting region EA which is not improved in light extraction efficiency since the light scattering layer 360 is not formed. Further, if the light scattering layer 360 has a greater area than the light emitting region EA or if the light scattering layer 360 is formed on the entire region of the lower substrate 110 of the organic light emitting display device 300, a blurring phenomenon may occur. A blurring phenomenon may occur at an outer periphery of the light emitting region EA due to light scattering on the light scattering layer 360. Therefore, in the organic light emitting display device 300 according to an exemplary embodiment of the present disclosure, since the light emitting region EA and the light scattering layer 360 are overlapped, the above-described problems, e.g., the non-uniformity in luminance and the blurring phenomenon can be solved.

Referring to FIG. 3C, the light scattering layer 360 is formed so as to be overlapped with the color filter 330. That is, the light scattering layer 360 is not formed on the entire region of the lower substrate 110, but the entire light scattering layer 360 is formed on the color filter 330. Therefore, the light scattering layer 360 may have the same area as the color filter 330 or may have a smaller area than the color filter 330.

Referring to FIG. 3A to FIG. 3C, in the organic light emitting display device 300 according to an exemplary embodiment of the present disclosure, light extraction efficiency of the organic light emitting display device 300 is improved by using the light scattering layer 360 including a dispersion particles 367 for light extraction. That is, among lights emitted from the organic light emitting layer 342, the light L2 incident to the light scattering layer 360 is scattered by the dispersion particles 367. The light L2 scattered by the dispersion particles 367 in the light scattering layer 360 may travel in various directions within the light scattering layer 360, and the light L2 emitted from the organic light emitting layer 342 and incident into the light scattering layer 360 is highly likely to travel to the color filter 330 by the dispersion particles 367. Therefore, an amount of light travelling to the color filter 330 is increased, which may result in an increase in light extraction efficiency of the organic light emitting display device 300, an increase in life of the organic light emitting display device 300, and a decrease in power consumption of the organic light emitting display device 300.

Further, in the organic light emitting display device 300 according to an exemplary embodiment of the present disclosure, since the light scattering layer 360 is formed by using the above-described photosensitive resin composition for light extraction, an etching process is not required when the light scattering layer 360 is formed. Further, since the photosensitive resin composition for light extraction can be photo-patterned, other elements around the light scattering layer 360 are prevented from damage even when the light scattering layer 360 is patterned as well as when the light scattering layer 360 is formed. Therefore, the light scattering layer 360 may be formed within the organic light emitting display device 300 without damaging the other elements of the organic light emitting display device 300. Further, by using the light scattering layer 360 having a patterned shape, e.g., by using the light scattering layer 360 which is patterned and overlapped with the light emitting region EA, it is possible to solve the problems, e.g., the non-uniformity in luminance and the blurring phenomenon, which may be caused by the light scattering layer 360.

As illustrated in FIG. 3A, if the organic light emitting display device 300 is a bottom-emission organic light emitting display device, among lights emitted from the organic light emitting layer 342, a light emitted toward the anode 341 passes through the anode 341 and travels toward a lower portion of the organic light emitting element 340. Further, among lights emitted from the organic light emitting layer 342, a light L1 emitted toward the cathode 343 is reflected at the cathode 343 and travels toward the anode 341. Then, a light L1 emitted toward the cathode 343 passes through the anode 341 and travels toward the lower portion of the organic light emitting element 340. Herein, on the basis of a distance between the anode 341 and the cathode 343, constructive interference may occur between light emitted from the organic light emitting layer 342 and directly passing through the anode 341 and a light emitted from the organic light emitting layer 342, reflected at the cathode 343, and then passing through an anode 341. Also, a light having a specific wavelength may be amplified. Therefore, the thickness of the organic light emitting layer 342 corresponding to a distance between the anode 341 and the cathode 343 may be determined on the basis of the specific wavelength for constructive interference.

In the organic light emitting display device 300 according to yet another exemplary embodiment of the present disclosure, the anode 341 of the organic light emitting element 340 is formed into a transparent conductive layer and the cathode 343 of the organic light emitting element 340 is formed into a reflective layer. Further, in order to realize a micro cavity, thickness of the organic light emitting layer 342 may be determined on the basis of a resonance distance. In the organic light emitting display device 300 according to yet another exemplary embodiment of the present disclosure which is a bottom-emission organic light emitting display device, a micro cavity is realized and light efficiency is increased. Therefore, power consumption of the organic light emitting display device 300 may be reduced and a life of the organic light emitting display device 300 may be increased.

Further, in the organic light emitting display device 300 according to yet another exemplary embodiment of the present disclosure, the light scattering layer 360 is disposed between the anode 341 and the lower substrate 110. Thus, problems regarding a decrease in lateral luminance caused by a micro cavity and a change in color coordinate depending on a viewing angle can be solved. That is, in the organic light emitting display device 300 according to yet another exemplary embodiment of the present disclosure, light extracted from the organic light emitting element 340 through the micro cavity is dispersed by the light scattering layer 360. Thus, a front luminance of the organic light emitting display device 300 can be increased and a lateral luminance of the organic light emitting display device 300 can also be increased.

Although FIG. 3A and FIG. 3B illustrate that the color filter 330 is formed on the overcoating layer 113, it is not limited thereto. The color filter 330 may be formed at a certain position between the bottom of the additional overcoating layer 350 and the lower substrate 110.

Figure 4A:
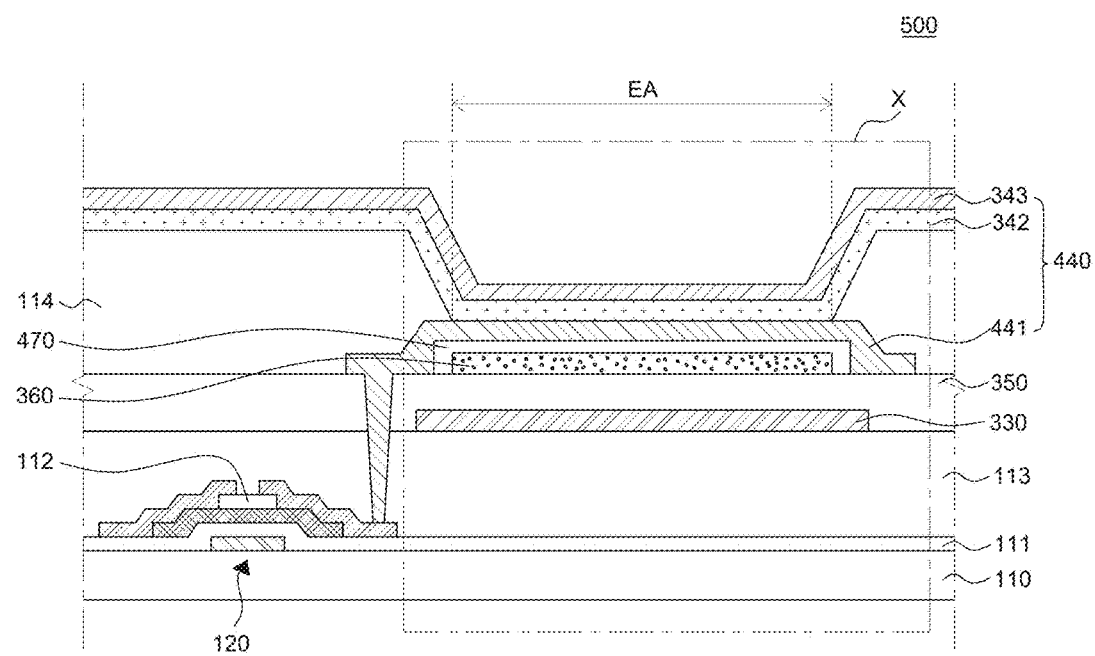
FIG. 4A is a cross-sectional view provided to describe an organic light emitting display device according to still another exemplary embodiment of the present disclosure.
Figure 4B:
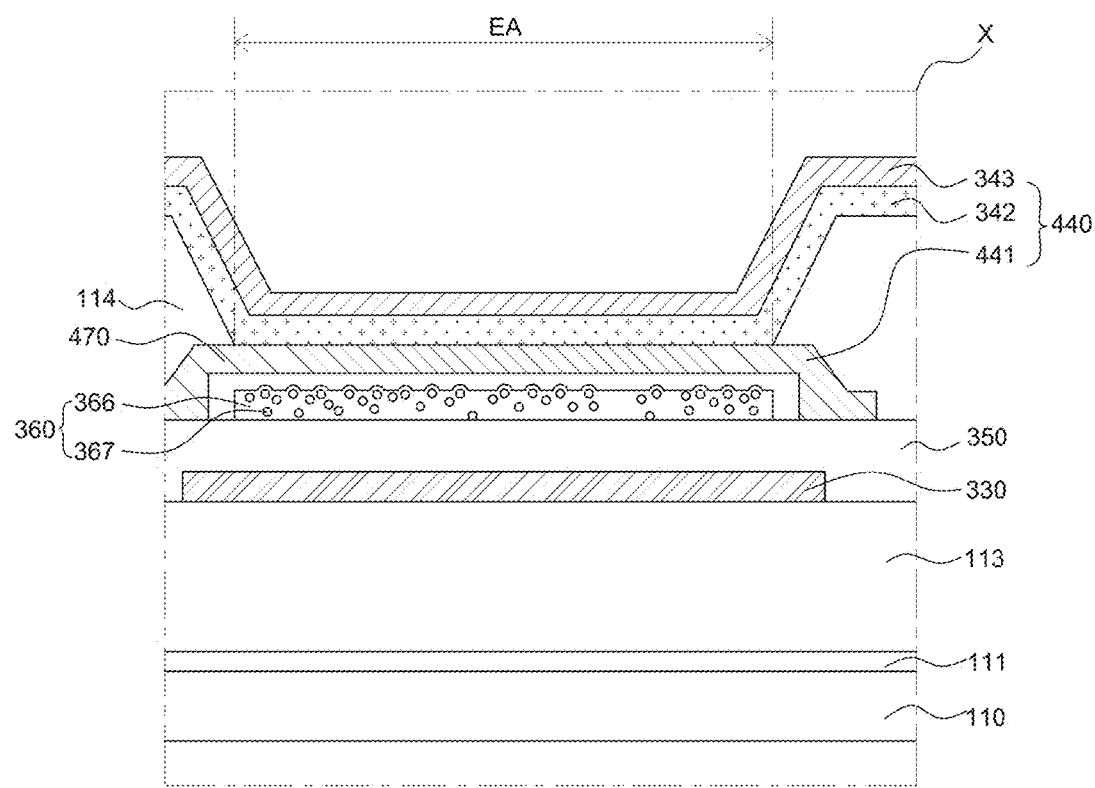
FIG. 4B is an enlarged cross-sectional view of an area X of FIG. 4A.

FIG. 4A is a cross-sectional view provided to describe an organic light emitting display device according to another exemplary embodiment of the present disclosure. FIG. 4B is an enlarged cross-sectional view of an area X of FIG. 4A. An organic light emitting display device illustrated in FIG. 4A and FIG. 4B is substantially the same as the organic light emitting display device 300 illustrated in FIG. 3A to FIG. 3C except that a high-refraction planarization film 470 is further included and the light scattering layer 360 has a non-flat top surface. Therefore, redundant description thereof will be omitted.

The light scattering layer 360 is formed on the additional overcoating layer 350. The light scattering layer 360 may have a flat top surface as illustrated in FIG. 3A and FIG. 3B. Further, the light scattering layer 360 may have a non-flat top surface as illustrated in FIG. 4B due to the dispersion particles 367 dispersed in the light scattering layer 360. That is, since the light scattering layer 360 includes the dispersion particles 367, the light scattering layer 360 may have a predetermined roughness. For convenience in explanation, FIG. 4A illustrates that the light scattering layer 360 has a flat top surface, but the light scattering layer 360 has a non-flat top surface as illustrated in FIG. 4B.

In order to planarize an upper portion of the light scattering layer 360, the high-refraction planarization film 470 is formed on the light scattering layer 360. Further, an anode 441 of an organic light emitting element 440 is formed on the additional overcoating layer 350 and a high-refraction planarization film 470. The high-refraction planarization film 470 is formed on the light scattering layer 360 so as to planarize the upper portion of the light scattering layer 360.

Thus, the anode 441 formed on the high-refraction planarization film 470 can also be formed so as to be flat. Therefore, due to the non-flat top surface of the light scattering layer 360, a top surface of the anode 441 has a portion which is peaky and sharply changed in morphology. Thus, it is possible to suppress a portion on the anode 441 where the organic light emitting layer 342 is not formed and also possible to suppress occurrence of a short between the anode 441 and the cathode 343.

The high-refraction planarization film 470 may have a refractive index of 1.65 or more. To be specific, the high-refraction planarization film 470 may have a refractive index of 1.65 or more and may be formed of a material having a transmissivity of 80% or more at a thickness of 1 μm. For example, the high-refraction planarization film 470 may be formed of a polymer material including a metal oxide such as titanium oxide ($TiO_2$) or zirconium oxide ($ZrO_2$), a high-refraction material such as silicon nitride (SiNx) formed by deposition such as CVD, and high-refraction polyimide.

The high-refraction planarization film 470 may be formed so as to cover the light scattering layer 360. Therefore, light emitted from the organic light emitting layer 342 is induced so as not to be transferred to its adjacent sub-pixel. However, light emitted from the organic light emitting layer 342 travels to the color filter 330 of the adjacent sub-pixel due to total reflection at an interface between the light scattering layer 360 and the bank 114 and an interface between the light scattering layer 360 and the additional overcoating layer 350. Thus, alight leakage phenomenon or a color mixing phenomenon is reduced. Further, as an amount of light traveling toward the color filter 330 of the adjacent sub-pixel is increased by the light scattering layer 360, light extraction efficiency of the organic light emitting display device 400 is increased and power consumption is decreased, resulting in an increase of life.

Hereinafter, details of an effect caused by the use of the light scattering layer 360 will be described with reference to Table 1.

TABLE 1

|  | Driving Voltage | cd/A | lm/W |
| --- | --- | --- | --- |
| Comparative Example 1 | 11.7 | 70 | 18 |
| Example 1 | 11.8 | 80 | 21 |
| Comparative Example 2 | 8.8 | 41 | 15 |
| Example 2 | 9.0 | 71 | 25 |

All of the Comparative Examples 1 and 2 and Examples 1 and 2 used a white organic light emitting layer having a 2-stack structure. To be more specific, an organic light emitting layer in which a blue light emitting layer and a yellow-green (YG) light emitting layer are stacked was used. In Comparative Example 1 and Example 1, there was used an organic light emitting layer having a total thickness of 360 nm and including a lower substrate, an overcoating layer, a high-refraction planarization layer, an anode, an organic layer of 50 nm, a yellow-green light emitting layer of 20 nm, an organic layer of 90 nm, a blue light emitting layer of 20 nm, an organic layer of 180 nm, and a cathode stacked from the bottom. In Comparative Example 2 and Example 2, there was used an organic light emitting layer having a total thickness of 230 nm and including a substrate, an overcoating layer, a high-refraction planarization layer, an organic layer of 50 nm, a yellow-green light emitting layer of 20 nm, an organic layer of 70 nm, a blue light emitting layer of 20 nm, an organic layer of 70 nm, and a cathode stacked from the bottom. In Comparative Example 1 and Example 1, the thickness of the organic light emitting layer was designed according to an optical condition in order to use a micro-cavity, and in Comparative Example 2 and Example 2, the thickness of the organic light emitting layer was designed without a limitation to an optical condition. Further, in Comparative Examples 1 and 2, a light scattering layer was not used, but in Examples 1 and 2, the above-described light scattering layer of the present disclosure was used. The above-described organic layers may include a hole injection layer, a hole transporting layer, a charge generation layer, an electron injection layer, an electron transporting layer, and the like.

In Comparative Example 1 and Example 1, the organic light emitting layers having the same thickness were used. However, it can be seen that current efficiency (cd/A) and power efficiency (lm/W) according to Example 1 using a light scattering layer were increased as compared with Comparative Example 1.

In Comparative Example 2 and Example 2, the organic light emitting layers having the same thickness were used. An optical condition was not satisfied by using the organic light emitting layer with a decreased thickness in Comparative Example 2 and Example 2. Thus, current efficiency and power efficiency according to Example 2 using a light scattering layer were increased as compared with Comparative Example 2, and sharply increased as compared with Comparative Example 1 and Example 1. Accordingly, it can be confirmed that Examples 1 and 2 using the light scattering layer of the present disclosure were improved in light extraction efficiency. Thus, current efficiency and power efficiency were improved as compared with Comparative Examples 1 and 2 without using the light scattering layer.

Hereinafter, more details will be described with reference to an exemplary embodiment of the present disclosure, but the scope of the present disclosure is not limited to the following Examples.

TABLE 2

| | Preparation Example 1 (wt. %) | Preparation Example 2 (wt. %) | Preparation Example 3 (wt. %) |
|---|---|---|---|
| Alkali soluble resin (copolymer of (meth)acrylate (MMA):glycidyl (meth)acrylate (GMA):styrene (Sty) at 2:5:2 | 10 | 10 | 10 |
| Unsaturated ethylene-based monomer (DPHA available from Kyoeisha Chemical Co., Ltd.) | 15 | 15 | 15 |
| Dispersion solution for light extraction (MHI White C024 available from Mikuni) | 20 | 15 | 10 |
| Photopolymerization initiator (OXE-01 available from Ciba) | 3 | 3 | 3 |
| Solvent (E-1: PGMEA/E-2: Cyclohexanone) available from Daejung Chemicals & Metals | E-1: 30 E-2: 22 | E-1: 30 E-2: 27 | E-1: 30 E-2: 32 |

Preparation Example 1

According to the contents of Preparation Example 1 as listed in Table 2, a photosensitive resin composition for light extraction was prepared by stirring an alkali soluble resin, an unsaturated ethylene-based monomer, a dispersion solution for light extraction, a photopolymerization initiator, and a solvent at room temperature.

Preparation Example 2

According to the contents of Preparation Example 2 as listed in Table 2, a photosensitive resin composition for light extraction was prepared by stirring an alkali soluble resin, an unsaturated ethylene-based monomer, a dispersion solution for light extraction, a photopolymerization initiator, and a solvent at room temperature.

Preparation Example 3

According to the contents of Preparation Example 3 as listed in Table 2, a photosensitive resin composition for light extraction was prepared by stirring an alkali soluble resin, an unsaturated ethylene-based monomer, a dispersion solution for light extraction, a photopolymerization initiator, and a solvent at room temperature.

Example 1

After an overcoating layer was formed on a lower substrate, the photosensitive resin composition for light extraction of Preparation Example 1 was coated to a thickness of 1 μm (700 rpm, 30 seconds), photo-exposed with 100 mJ/cm$^2$ by using a mask, and immersed and developed in a development solution (0.04%, KOH) for 100 seconds. Then, baked in an oven at 230° C., so that a light scattering layer was formed. Then, a high-refraction planarization film (Brewer Science, Inc., D1) was formed to 0.5 μm, and an organic light emitting element including an organic light emitting layer formed of a green phosphorescent material was manufactured.

Example 2

An organic light emitting display device was manufactured under the same process condition as Example 1 except that the photosensitive resin composition for light extraction of Preparation Example 2 was used.

Example 3

An organic light emitting display device was manufactured under the same process condition as Example 1 except that the photosensitive resin composition for light extraction of Preparation Example 3 was used.

Comparative Example 1

An organic light emitting element was manufactured under the same process condition as Example 1 except that a mask was not used and a light scattering layer was formed by a whole surface exposure with 100 mJ/cm$^2$.

Comparative Example 2

An organic light emitting element was manufactured by the same process as Example 1 except that a light scattering layer and a high-refraction planarization film were not formed.

When the organic light emitting display devices of Examples 1 to 3 and Comparative Examples 1 and 2 were driven with 10 mA/cm², a driving voltage, current efficiency (cd/A), color coordinates, and a haze value were as listed in Table 3.

TABLE 3

| | Driving Voltage (V) | Current Efficiency (cd/A) | Color Coordinates | Haze |
|---|---|---|---|---|
| Example 1 | 6.0 | 65 | 0.34, 0.62 | 76% |
| Example 2 | 6.1 | 62 | 0.33, 0.61 | 70% |
| Example 3 | 6.0 | 58 | 0.34, 0.61 | 60% |
| Comparative Example 1 | 6.2 | 65 | 0.34, 0.62 | 76% |
| Comparative Example 2 | 6.0 | 50 | 0.34, 0.61 | — |

Referring to Table 3, by comparing Comparative Example 2 where a light scattering layer was not applied and Examples 1 and 3 where a light scattering layer was used, it can be seen that the driving voltage of Examples 1 to 3 is almost equal to the driving voltage of Comparative Example 2. However, the current efficiency of Examples 1 to 3 is increased by about 20 to 30% as compared with the current efficiency of Comparative Example 2. Further, it can be seen that even if the light scattering layer is added, there is little difference between the color coordinates of Examples 1 to 3 and the color coordinates of Comparative Example 2.

By comparing Examples 1 and 3, it can be seen that as the weight percent of the dispersion solution for light extraction including dispersed dispersion particles increased, the haze value increased. Thus, the efficiency of the organic light emitting display device was improved.

Meanwhile, Example 1 and Comparative Example 1 using the photosensitive resin compositions for light extraction having the same components are substantially identical to each other in a driving value, current efficiency, color coordinates, and a haze value. However, a blurring phenomenon caused by patterning of the light scattering layer occurs in Comparative Example 1 more remarkably than Example 1. More details thereof will be described with reference to FIG. 5.

Figure 5:
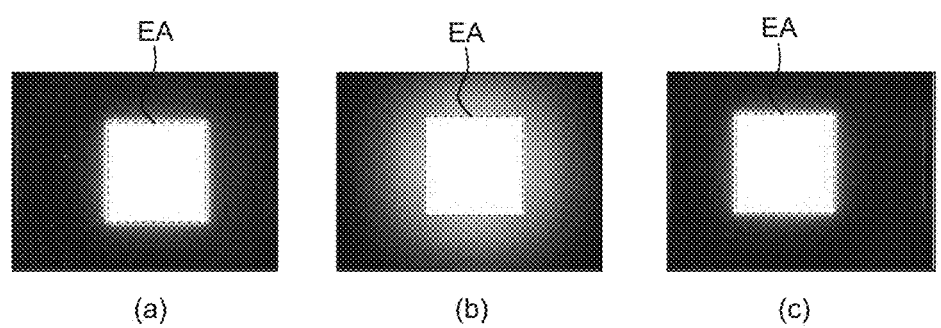
FIG. 5 provides images to describe blurring in organic light emitting display devices according to exemplary embodiments and Comparative Examples of the present disclosure.

FIG. 5 provides images to describe blurring in organic light emitting display devices according to exemplary embodiments and Comparative Examples of the present disclosure. FIG. 5(a) is a light emission image of Example 1, FIG. 5(b) is a light emission image of Comparative Example 1, and FIG. 5(c) is a light emission image of Comparative Example 2.

Firstly, referring to FIG. 5(c), it can be seen that since a light scattering layer was not used in Comparative Example 2, a blurring phenomenon did not occur at an outer periphery of a light emitting region EA. Further, referring to FIG. 5(a), it can be seen that since a light scattering layer was used in Example 1 and the light scattering layer was patterned so as to be overlapped with a light emitting region EA corresponding thereto. Thus, a blurring phenomenon did not occur at an outer periphery of a light emitting region EA in Example 1, like Comparative Example 2. Furthermore, referring to FIG. 5(b), it can be seen that since a light scattering layer was formed on the entire overcoating layer in Comparative Example 1, a blurring phenomenon severely occurred at an outer periphery of a light emitting region EA.

That is, it can be seen that since the photosensitive resin composition for light extraction can be photo-patterned without damaging other elements, the light scattering layer can be formed so as to be overlapped only with the light emitting region EA. Thus, a blurring phenomenon does not occur as exhibited in Example 1, but occurs in Comparative Example 1 where a patterning process cannot be performed to a light scattering layer and the light scattering layer is formed on the front surface.

Figure 6:
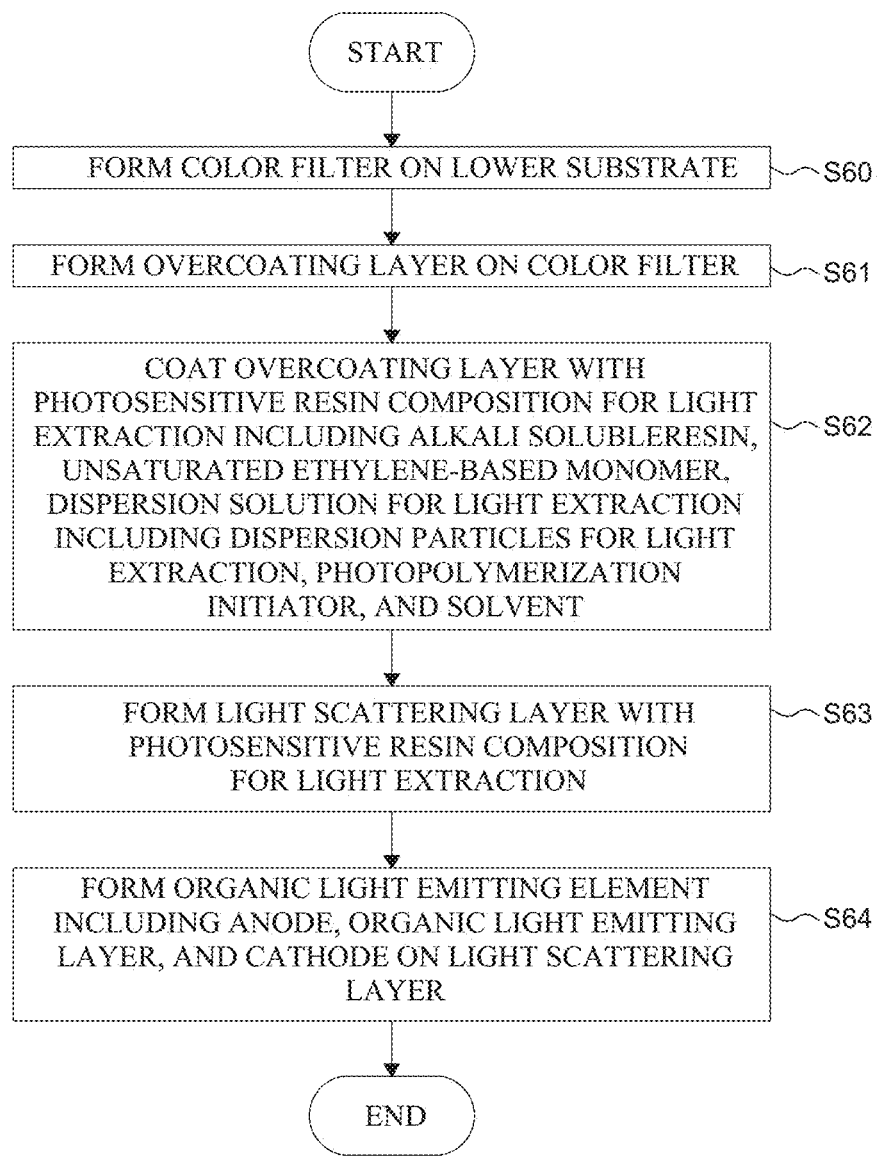
FIG. 6 is a flowchart provided to describe a method for manufacturing an organic light emitting display device according to an exemplary embodiment of the present disclosure.

FIG. 6 is a flowchart provided to describe a method for manufacturing an organic light emitting display device according to an exemplary embodiment of the present disclosure. FIG. 7A to FIG. 7D are process cross-sectional views provided to describe a method for manufacturing an organic light emitting display device according to an exemplary embodiment of the present disclosure. The process cross-sectional views illustrated in FIG. 7A to FIG. 7D are provided to describe a method for manufacturing the organic light emitting display device 300 described with reference to FIG. 3A and FIG. 3B, and redundant description will be omitted.

Firstly, the color filter 330 is formed on the lower substrate 110 (S60), the additional overcoating layer 350 is formed on the color filter 330 (S61), and a photosensitive resin composition 369 for light extraction including an alkali soluble resin, an unsaturated ethylene-based monomer, a dispersion solution for light extraction, a photopolymerization initiator, and a solvent is coated on the additional overcoating layer 350 (S62).

Figure 7A:
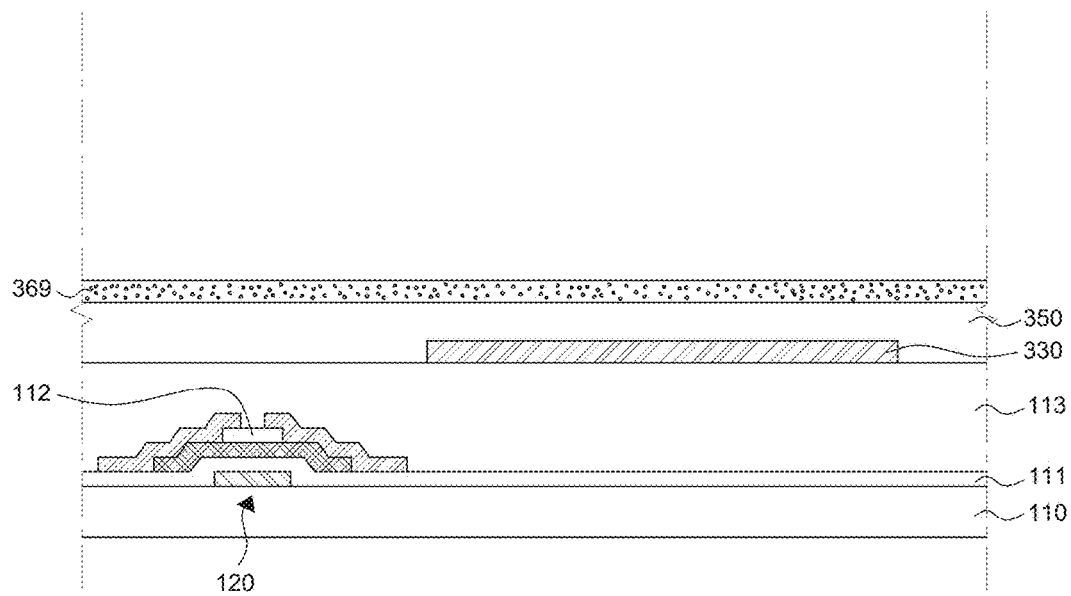
FIG. 7A to FIG. 7D are process cross-sectional views provided to describe a method for manufacturing an organic light emitting display device according to an exemplary embodiment of the present disclosure.

Referring to FIG. 7A, the photosensitive resin composition 369 for light extraction is coated on the additional overcoating layer 350. The photosensitive resin composition 369 for light extraction includes the alkali soluble resin, the unsaturated ethylene-based monomer, the dispersion solution for light extraction including dispersion particles for light extraction, the photopolymerization initiator, and the solvent and may be formed of the above-described materials.

The photosensitive resin composition 369 for light extraction may be coated on the additional overcoating layer 350 by various coating methods such as a spin-coating method and may be coated on the entire region of the additional overcoating layer 350.

Then, the light scattering layer 360 is formed of the photosensitive resin composition 369 for light extraction by using a photo-patterning process (S63).

Figure 7B:
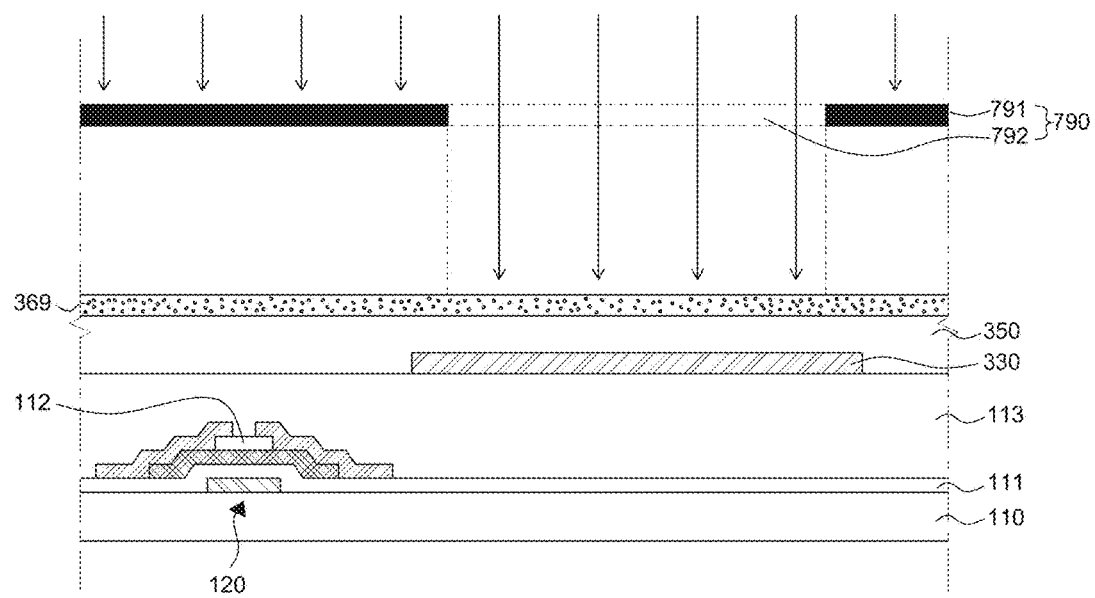

Referring to FIG. 7B, the photosensitive resin composition 369 for light extraction is partially photo-exposed using a mask 790 in order to form the light scattering layer 360. To be specific, the mask 790 including a shielding part 791 and a transmission part 792 is disposed on the photosensitive resin composition 369 for light extraction and a UV exposure is performed on the mask 790. Thus, the photosensitive resin composition 369 for light extraction can be partially photo-exposed. Since the photosensitive resin composition 369 for light extraction is partially photo-exposed, the photosensitive resin composition 369 for light extraction exposed through the transmission part 792 of the mask 790 is in an insoluble state. However, the photosensitive resin composition 369 for light extraction which is not exposed through the shielding part 791 of the mask 790 is in a soluble state.

Figure 7C:
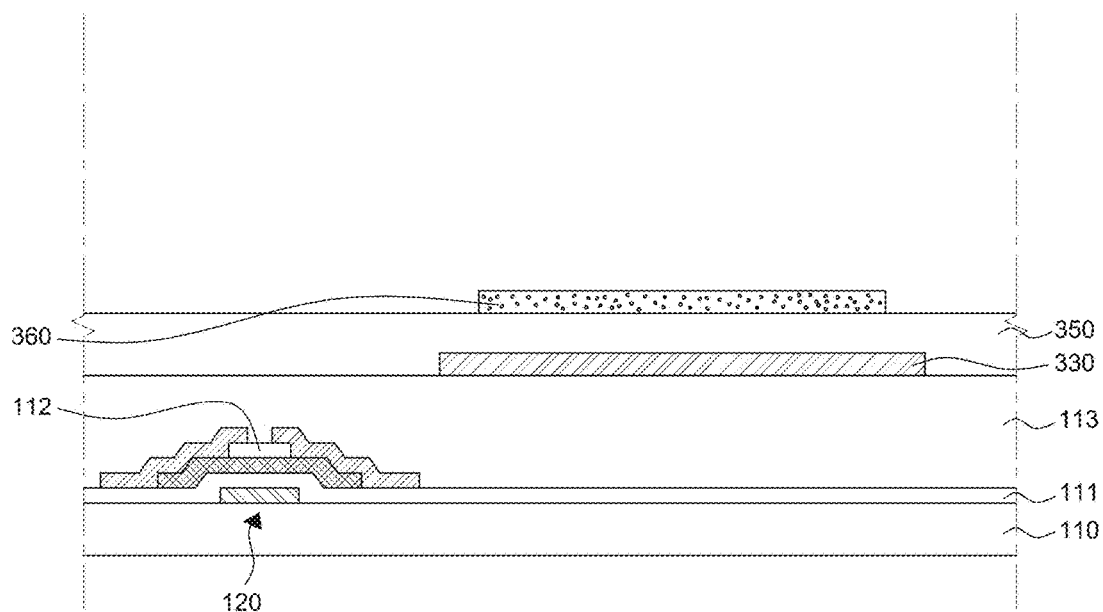

Then, the photosensitive resin composition 369 for light extraction to which the photo-exposure process is performed, is developed. As the photosensitive resin composition 369 for light extraction is developed, only the photo-exposed photosensitive resin composition 369 for light extraction remains and the light scattering layer 360 is formed as illustrated in FIG. 7C. In some exemplary embodiments, a baking process may be performed after the development process.

In the present specification, although the photosensitive resin composition 369 for light extraction has been illustrated as a negative photosensitive resin composition, the photosensitive resin composition 369 for light extraction may be prepared as a positive photosensitive resin composition.

Then, the organic light emitting element 340 including the anode 341, the organic light emitting layer 342, and the cathode 343 is formed on the light scattering layer 360 (S64).

Figure 7D:
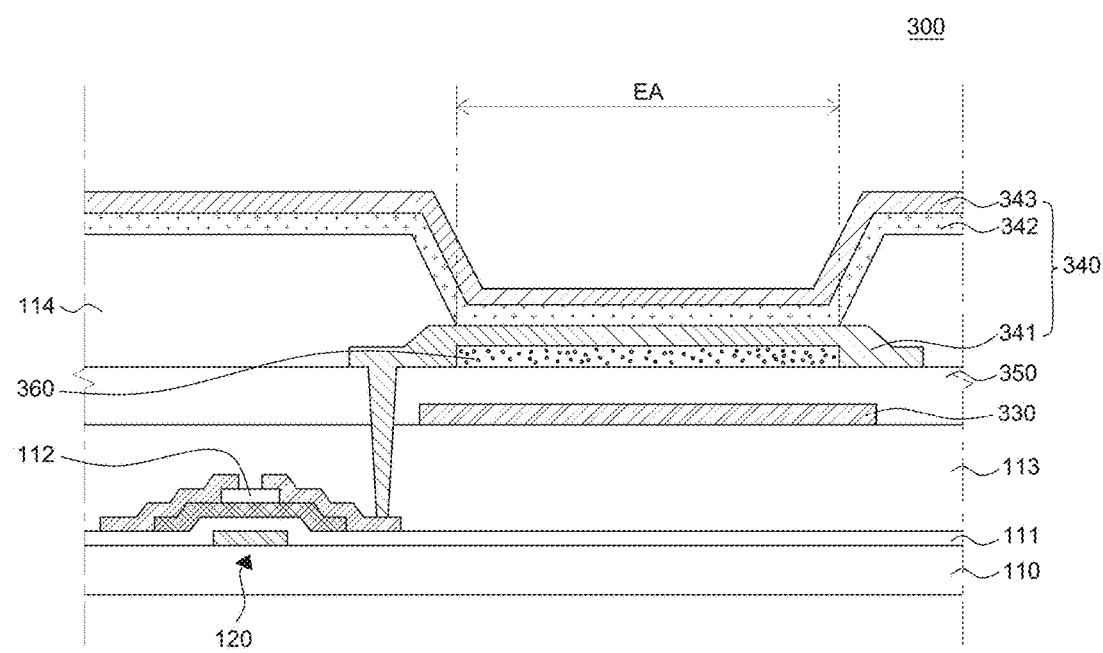

Referring to FIG. 7D, after a contact hole is formed in the overcoating layer 113 and the additional overcoating layer 350, the anode 341 is formed so as to electrically connect the anode 341 with the source electrode of the thin film transistor 120. Further, the bank 114, the organic light emitting layer 342, and the cathode 343 may be formed in sequence.

A high-refraction planarization layer may be formed between the light scattering layer 360 and the anode 341. The high-refraction planarization layer can be the same as the high-refraction planarization layer described with reference to FIG. 4A and FIG. 4B and configured to planarize an upper portion of the light scattering layer 360.

Hereinafter, various features of a photosensitive resin composition according to an exemplary embodiment of the present disclosure will be described.

According to another feature of the present disclosure, the alkali soluble resin may be a copolymer polymerized from one or a mixture of two or more materials selected among unsaturated carboxylic acid and unsaturated carboxylic acid anhydride and an epoxy group-containing unsaturated compound.

According to yet another feature of the present disclosure, the alkali soluble resin is a copolymer polymerized from at least one of one or a mixture of two or more selected from unsaturated carboxylic acid and unsaturated carboxylic acid anhydride, an epoxy-containing unsaturated compound, an olefin-based unsaturated carboxylic acid ester compound other than the unsaturated carboxylic acid and the unsaturated carboxylic acid anhydride, and one or more materials selected among an olefin-based unsaturated compound other than the unsaturated carboxylic acid, the unsaturated carboxylic acid anhydride, and the olefin-based unsaturated carboxylic acid ester compound.

According to still another feature of the present disclosure, the unsaturated ethylene-based monomer may be an acryl monomer having two or more unsaturated ethylene bonds.

According to still another feature of the present disclosure, a difference in refractive index between the dispersion particle and the alkali soluble resin and a difference in refractive index between the dispersion particle and the unsaturated ethylene-based monomer may be 0.2 or more.

According to still another feature of the present disclosure, the dispersion particle may be a hollow particle including a metal oxide having a refractive index of 1.6 or more or a gas part having a refractive index of 1.2 or less.

Hereinafter, various features of an organic light emitting display device according to an exemplary embodiment of the present disclosure will be described.

According to another feature of the present disclosure, the organic light emitting display device may further include: a high-refraction planarization film between the light scattering layer and the organic light emitting element. It is configured to planarize an upper portion of the light scattering layer, and the high-refraction planarization film may have a refractive index of 1.65 or more.

According to yet another feature of the present disclosure, the light scattering layer may be overlapped with the color filter.

According to still another feature of the present disclosure, the organic light emitting element may include a light emitting region defined by a bank, and the light emitting region may be overlapped with the light scattering layer.

According to still another feature of the present disclosure, the photosensitive resin may include an alkali soluble resin and an unsaturated ethylene-based monomer.

According to still another feature of the present disclosure, the photosensitive resin has a refractive index of 1.4 to 1.6, and the dispersion particle may be a metal oxide having a refractive index of 1.6 or more. A hollow particle may have a refractive index of 1.2 or less.

According to still another feature of the present disclosure, the dispersion particle may have a diameter of 200 nm to 1 µm.

Hereinafter, various features of an organic light emitting display device according to another exemplary embodiment of the present disclosure will be described.

According to another feature of the present disclosure, the organic light emitting display device may further include a color filter on the light scattering layer.

According to yet another feature of the present disclosure, the dispersion particle may have a diameter of 100 nm to 700 nm.

According to still another feature of the present disclosure, the organic light emitting element may be plural in number and in each of a plurality of sub-pixels. Further, the plurality of sub-pixels may include a red sub-pixel, a green sub-pixel, and a blue sub-pixel, and a distance between the anode and the cathode may be different in the red sub-pixel, the green sub-pixel, and the blue sub-pixel.

Hereinafter, various features of a method for manufacturing an organic light emitting display device according to an exemplary embodiment of the present disclosure will be described.

According to another feature of the present disclosure, the forming a light scattering layer may include: partially photo-exposing the photosensitive resin composition using a mask; and developing the photosensitive resin composition.

According to yet another feature of the present disclosure, the method for manufacturing an organic light emitting display device may further include: forming a high-refraction planarization layer configured to planarize an upper portion of the light scattering layer between the light scattering layer and the organic light emitting element.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:
1. An organic light emitting display device comprising:
a lower substrate;
a color filter on the lower substrate;
an overcoating layer on the color filter;
an organic light emitting element on the overcoating layer and including an anode having transparent conductive layer characteristics, an organic light emitting layer on the anode, and a cathode on the organic light emitting layer; and a light scattering layer between the overcoating layer and the organic light emitting element, the light scattering layer including dispersion particles configured to improve light extraction with respect to light emitted from the organic light emitting element and configured to compensate a viewing angle with respect to the light emitted from the organic light emitting element, and including a photosensitive resin, wherein an area of the light scattering layer is same as an area of the color filter or is smaller than the area of the color filter.

2. The organic light emitting display device according to claim 1, further comprising:

a high-refraction planarization film between the light scattering layer and the organic light emitting element, the high-refraction planarization film configured to planarize an upper portion of the light scattering layer, wherein the high-refraction planarization film has a refractive index of 1.65 or more.

3. The organic light emitting display device according to claim 1, wherein the light scattering layer is overlapped with the color filter.

4. The organic light emitting display device according to claim 1, wherein the organic light emitting element includes a light emitting region defined by a bank, and the light emitting region is overlapped with the light scattering layer.

5. The organic light emitting display device according to claim 1, wherein the photosensitive resin includes an alkali soluble resin and an unsaturated ethylene-based monomer.

6. The organic light emitting display device according to claim 1, wherein the photosensitive resin has a refractive index of 1.4 to 1.6, and the dispersion particle is a metal oxide having a refractive index of 1.6 or more or a hollow particle having a refractive index of 1.2 or less.

7. The organic light emitting display device according to claim 1, wherein the dispersion particle has a diameter of 200 nm to 1 μm.

8. An organic light emitting display device comprising:

an organic light emitting element comprising an anode, an organic light emitting layer on the anode, and a cathode on the organic light emitting layer and having semi-transmissive layer characteristics, the anode including a reflective layer and a transparent conductive layer on the reflective layer;

a light scattering layer on the cathode and including a photosensitive resin and dispersion particles dispersed in the photosensitive resin and configured to improve light extraction with respect to a light emitted from the organic light emitting element and to compensate a viewing angle with respect to the light emitted from the organic light emitting element; and a color filter on the light scattering layer, wherein an area of the light scattering layer is same as an area of the color filter or is smaller than the area of the color filter.

9. The organic light emitting display device of claim 8, wherein the dispersion particle has a diameter of 100 nm to 700 nm.

10. The organic light emitting display device of claim 8, each of a plurality of sub-pixels comprising the organic light emitting element and other organic light emitting elements, wherein:

the plurality of sub-pixels includes a red sub-pixel, a green sub-pixel, and a blue sub-pixel, and a distance between the anode and the cathode is different in the red sub-pixel, the green sub-pixel, and the blue sub-pixel.

* * * * *